(12) United States Patent
Volkovich et al.

(10) Patent No.: US 11,353,799 B1
(45) Date of Patent: Jun. 7, 2022

(54) SYSTEM AND METHOD FOR ERROR REDUCTION FOR METROLOGY MEASUREMENTS

(71) Applicant: KLA Corporation, Milpitas, CA (US)

(72) Inventors: Roie Volkovich, Hadera (IL); Liran Yerushalmi, Zicron Yaacob (IL); Anna Golotsvan, Qiryat Tivon (IL); Rawi Dirawi, Nazareth (IL); Chen Dror, Tivon (IL); Nir BenDavid, Migdal Ha'emek (IL); Amnon Manassen, Haifa (IL); Oren Lahav, Adi (IL); Shlomit Katz, Beit Hanania (IL)

( * ) Notice: Subject to any disclaimer, the term of this patent is extended or adjusted under 35 U.S.C. 154(b) by 14 days.

(21) Appl. No.: 16/928,468

(22) Filed: Jul. 14, 2020

Related U.S. Application Data

(60) Provisional application No. 62/877,390, filed on Jul. 23, 2019.

(51) Int. Cl.
*G03F 7/20* (2006.01)
*H01L 21/66* (2006.01)
*G01B 11/27* (2006.01)

(52) U.S. Cl.
CPC ........ *G03F 7/70633* (2013.01); *G01B 11/272* (2013.01); *G03F 7/70625* (2013.01); *G03F 7/70683* (2013.01); *H01L 22/12* (2013.01)

(58) Field of Classification Search
CPC ........ H01L 22/12; G01B 11/02; G01B 11/14; G01B 11/27; G01B 11/272; G03F 7/70683; G03F 7/70625; G03F 7/70633; G01N 21/9501
See application file for complete search history.

(56) References Cited

U.S. PATENT DOCUMENTS 9,188,974 B1 * 11/2015 Mack ............... G05B 19/41875
9,851,300 B1 * 12/2017 Bringoltz ............ G03F 7/70633
10,473,460 B2   11/2019 Gutman et al.
(Continued)

FOREIGN PATENT DOCUMENTS

JP    2017518533 A    7/2017
WO    2011026055 A2   3/2011

OTHER PUBLICATIONS

PCT International Search Report and Written Opinion for International Application No. PCT/US2020/043160 dated Oct. 30, 2020, 11 pages.

*Primary Examiner* — Gordon J Stock, Jr.
(74) *Attorney, Agent, or Firm* — Suiter Swantz pc llo

(57) ABSTRACT

A metrology system includes a controller communicatively coupled to one or more metrology tools, the controller including one or more processors configured to execute program instructions causing the one or more processors to receive one or more metrology measurements of one or more metrology targets of a metrology sample, a metrology target of the one or more metrology targets including one or more target designs with one or more cells, the one or more target designs being generated on one or more layers of the metrology sample; determine one or more errors based on the one or more metrology measurements; and determine one or more correctables to adjust one or more sources of error corresponding to the one or more errors, the one or more correctables being configured to reduce an amount of noise in the one or more metrology measurements generated by the one or more sources of errors.

25 Claims, 21 Drawing Sheets

(56) References Cited

U.S. PATENT DOCUMENTS

| | | | |
|---|---|---|---|
| 10,533,848 B2 | 1/2020 | Shchegrov et al. | |
| 11,085,754 B2* | 8/2021 | Amit | G03F 7/70633 |
| 2005/0193362 A1 | 9/2005 | Phan et al. | |
| 2013/0107259 A1 | 5/2013 | Choi et al. | |
| 2014/0136137 A1* | 5/2014 | Tarshish-Shapir | G01N 21/4788 702/108 |
| 2015/0204664 A1* | 7/2015 | Bringoltz | G02B 27/4272 356/492 |
| 2016/0266505 A1* | 9/2016 | Amit | G03F 7/70633 |
| 2016/0307850 A1* | 10/2016 | Lin | H01L 29/785 |
| 2016/0313116 A1 | 10/2016 | Ghinovker et al. | |
| 2016/0370710 A1* | 12/2016 | Wardenier | G01B 11/03 |
| 2017/0023357 A1* | 1/2017 | Turovets | H01L 21/0337 |
| 2017/0090302 A1 | 3/2017 | Slotboom et al. | |
| 2019/0049858 A1* | 2/2019 | Gurevich | G03F 7/70633 |
| 2019/0137412 A1* | 5/2019 | Hajaj | G03F 7/70633 |
| 2020/0117100 A1* | 4/2020 | Corliss | G03F 7/70358 |
| 2021/0149313 A1* | 5/2021 | Volkovich | G03F 7/705 |
| 2021/0240089 A1* | 8/2021 | Golotsvan | G03F 7/70683 |

* cited by examiner

| Target | Overlay Measurement | OVL [nm] | | Residual [nm] | | [%] Residual improvment using combined measurements | |
|---|---|---|---|---|---|---|---|
| | | X | Y | X | Y | X | Y |
| 202a | 300a | 8.99 | 7.67 | 3.28 | 3.19 | 19% | 17% |
| 202b | 300b | 8.86 | 8.02 | 2.95 | 3.30 | 10% | 19% |
| 202c | 300c | 9.89 | 8.87 | 2.93 | 3.01 | 9% | 12% |
| 202d | 300d | 11.42 | 8.33 | 3.82 | 3.49 | 30% | 24% |
| | 302 | 8.65 | 7.25 | 2.66 | 2.66 | -- | -- |

FIG. 4

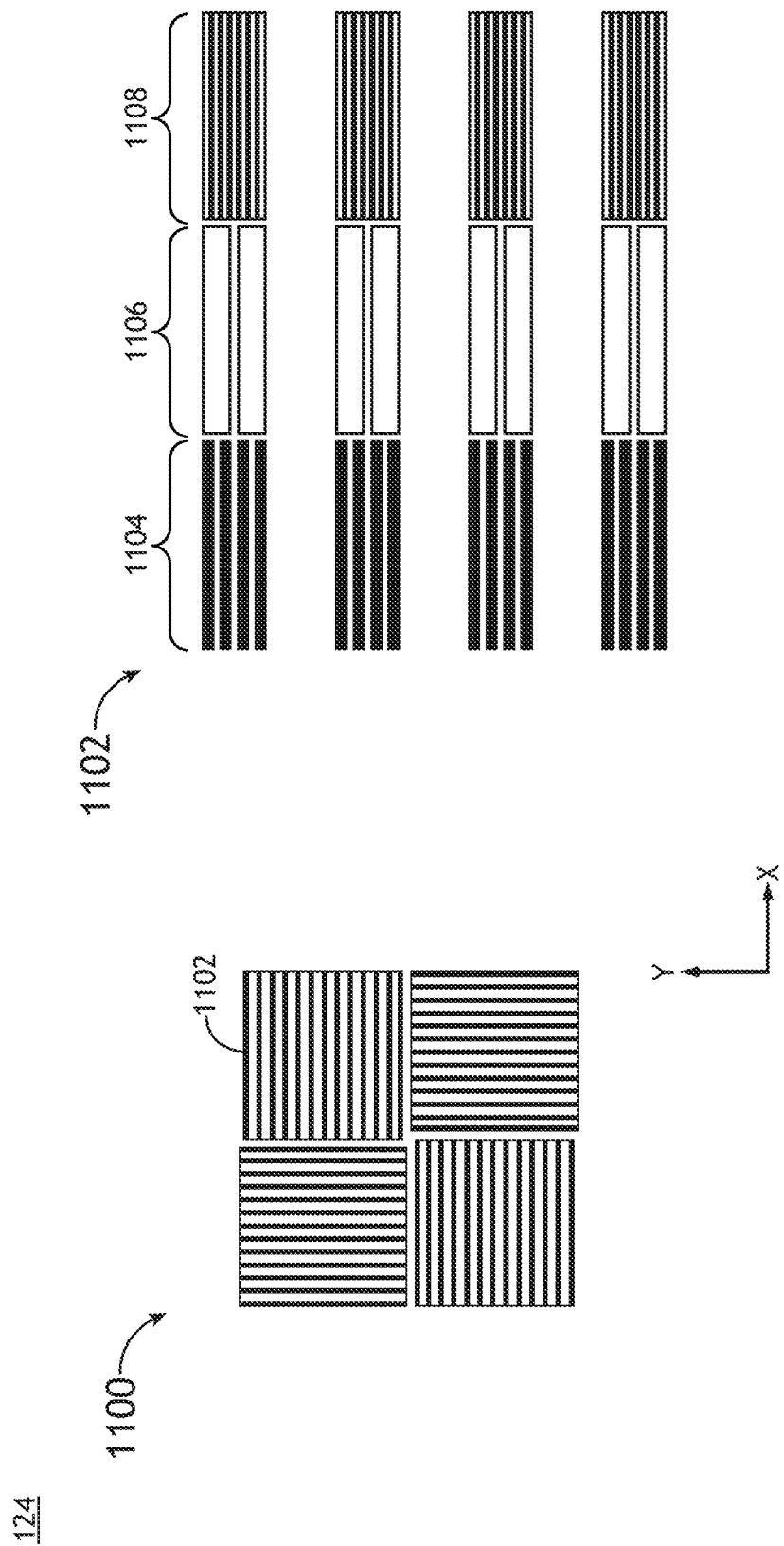

SYSTEM AND METHOD FOR ERROR REDUCTION FOR METROLOGY MEASUREMENTS

CROSS-REFERENCE TO RELATED APPLICATIONS

The present application claims the benefit under 35 U.S.C. § 119(e) of U.S. Provisional Patent Application Ser. No. 62/877,390, filed Jul. 23, 2019, titled ERROR REDUCTION FOR OVL METROLOGY MEASUREMENTS, naming Roie Volkovich, Liran Yerushalmi, Anna Golotsvan, Shlomit Katz, Rawi Dirawi, Chen Dror, Nir BenDavid, Amnon Manassen, and Oren Lahav as inventors, which is incorporated herein by reference in the entirety.

TECHNICAL FIELD

The present invention generally relates to metrology systems, and, more particularly, to a system and method for error reduction in metrology measurements.

BACKGROUND

Overlay metrology systems typically measure the alignment of multiple layers of a sample by characterizing overlay metrology targets having target features located on sample layers of interest. Current systems involve performing the measurements on a single overlay metrology target, with overlay values generated for the single overlay metrology target between a current layer and a previous layer of the sample. This system can be sensitive to different errors originating from error sources such as process variations, lithography processes, and metrology processes, which may result in an increased throughput measurement time and may require additional calibration to reduce the type and/or number of error sources.

Therefore, it would be desirable to provide a system and method that cure the shortfalls of the previous approaches identified above.

SUMMARY

A system for error reduction in metrology measurements is disclosed, in accordance with one or more embodiments of the present disclosure. In one embodiment, the system includes a controller communicatively coupled to one or more metrology tools configured to hold a metrology sample, the controller including one or more processors configured to execute program instructions. In another embodiment, the program instructions cause the one or more processors to receive one or more metrology measurements of one or more metrology targets of the metrology sample, a metrology target of the one or more metrology targets including one or more target designs with one or more cells, the one or more target designs being generated on one or more layers of the metrology sample. In another embodiment, the program instructions cause the one or more processors to determine one or more errors based on the one or more metrology measurements. In another embodiment, the program instructions cause the one or more processors to determine one or more correctables to adjust one or more sources of error corresponding to the one or more errors, the one or more correctables being configured to reduce an amount of noise in the one or more metrology measurements generated by the one or more sources of errors.

A system for error reduction in metrology measurements is disclosed, in accordance with one or more embodiments of the present disclosure. In one embodiment, the system includes one or more metrology tools configured to hold a metrology sample. In another embodiment, the system includes a controller communicatively coupled to the one or more metrology tools, the controller including one or more processors configured to execute program instructions. In another embodiment, the program instructions cause the one or more processors to receive one or more metrology measurements of one or more metrology targets of the metrology sample, a metrology target of the one or more metrology targets including one or more target designs with one or more cells, the one or more target designs being generated on one or more layers of the metrology sample. In another embodiment, the program instructions cause the one or more processors to determine one or more errors based on the one or more metrology measurements. In another embodiment, the program instructions cause the one or more processors to determine one or more correctables to adjust one or more sources of error corresponding to the one or more errors, the one or more correctables being configured to reduce an amount of noise in the one or more metrology measurements generated by the one or more sources of errors.

A method is disclosed in accordance with one or more embodiments of the present disclosure. In one embodiment, the method may include, but is not limited to, receiving one or more metrology measurements of one or more metrology targets of a metrology sample from one or more metrology tools, a metrology target of the one or more metrology targets including one or more target designs with one or more cells, the one or more target designs being generated on one or more layers of the metrology sample. In another embodiment, the method may include, but is not limited to, determining one or more errors based on the one or more metrology measurements. In one embodiment, the method may include, but is not limited to, determining one or more correctables to adjust one or more sources of error corresponding to the one or more errors, the one or more correctables being configured to reduce an amount of noise in the one or more metrology measurements generated by the one or more sources of error.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 4 illustrates a table of overlay measurements of SCOL metrology targets, in accordance with one or more embodiments of the present disclosure;

FIG. 11A illustrates a multi-cell SCOL target including multiple pitches, in accordance with one or more embodiments of the present disclosure;

FIG. 11B illustrates a cell of a multi-cell SCOL target including multiple pitches, in accordance with one or more embodiments of the present disclosure;

DETAILED DESCRIPTION

Figure 1A:
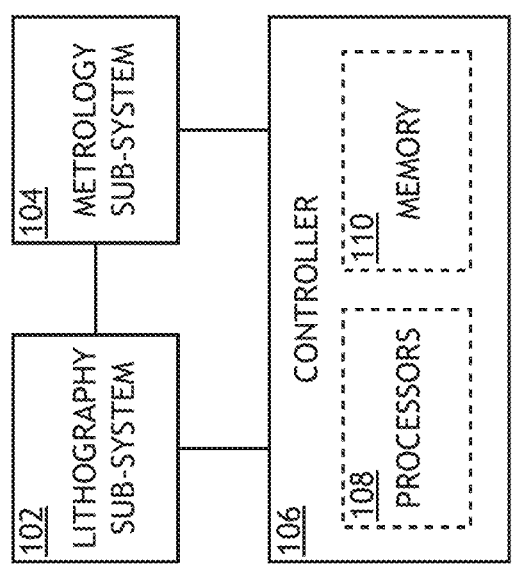
FIG. 1A is simplified view illustrating a fabrication system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Reference will now be made in detail to the subject matter disclosed, which is illustrated in the accompanying drawings.

Overlay (OVL) metrology tools may utilize a variety of overlay metrology technologies to determine the overlay of sample layers. For example, the overlay metrology technologies may include, but are not limited to, imaging, scatterometry, or a combination of overlay metrology technologies. The overlay measurements taken with the overlay metrology technologies may have noise, which may result in an increased throughput measurement time and may require additional calibration to reduce the type and/or number of error sources. Methodologies and technologies related to overlay metrology, however, are increasingly subject to stricter requirements, resulting in a need for an increase in noise reduction in metrology target measurements.

Advanced processes may require an ability to control both a center of a population of very specific pitch structures and an ability to estimate a variability within device structures due to lithography and other processes variability for different device structures. Where the metrology target includes only a single pitch mimicking a device overlay, the correlation between the device overlay and metrology target overlay may be improved as the device pitch is much smaller than the metrology target pitch. In addition, there may be induced error in the metrology overlay due to lithography, printing location, other processes having an impact (e.g., etching, doping, or the like), and/or metrology tools.

Embodiments of the present disclosure are directed to a system and method for error reduction in metrology measurements. Specifically, embodiments of the present disclosure are directed to configurations of a metrology sample including multiple metrology targets, and a corresponding system configured to fabricate and/or measure the metrology sample.

Advantages of the present disclosure include a methodology to reduce noise using one or more overlay (OVL) metrology targets. For example, the methodology may use multiple overlay metrology targets with a same or similar target design (e.g., in some cases, an identical target design), or instead some with a different target design. By way of another example, the methodology may include an improved target design with a different target design embedded in a same or similar target cell.

Advantages of the present disclosure also include using overlay measurements with multiple metrology targets including different designs or one overlay metrology target with multiple layers to reduce noise affecting the overlay measurements.

Advantages of the present disclosure also include an improved target design which may be used with the methodology using multiple overlay metrology targets to mimic noise reduction and improve on product overlay (OPO). For example, the improved target design may be a scatterometry overlay (SCOL) or advanced imaging metrology (AIM) target design. For instance, the SCOL or AIM target design may include and/or combine more than one target design (e.g., such as a multi-cell or multi-layer SCOL target, or an AIM target with only a set of layers to improve one or more of a residual, a performance, and/or an accuracy of the methodology.

Advantages of the present disclosure include a single metrology target with multiple pitches embedded in target cells, instead of or in addition to multiple metrology targets having a same or similar or a different pitch. The single metrology target may allow for an ability to estimate a variability within device structures due to lithography and other processes variability. The single metrology target may allow for metrology target noise reduction. The single metrology target may be an improved device for targeting error. The single metrology target may allow for using electron-beam (or e-beam) measurements for accuracy improvements. The single metrology target with multiple pitches may result in improved usage of wafer or sample real-estate and savings in measurement time, resulting in an improved cost of ownership.

FIGS. 1-14 in general illustrate a system and method for error reduction in metrology measurements, in accordance with one or more embodiments of the present disclosure.

Figure 1B:
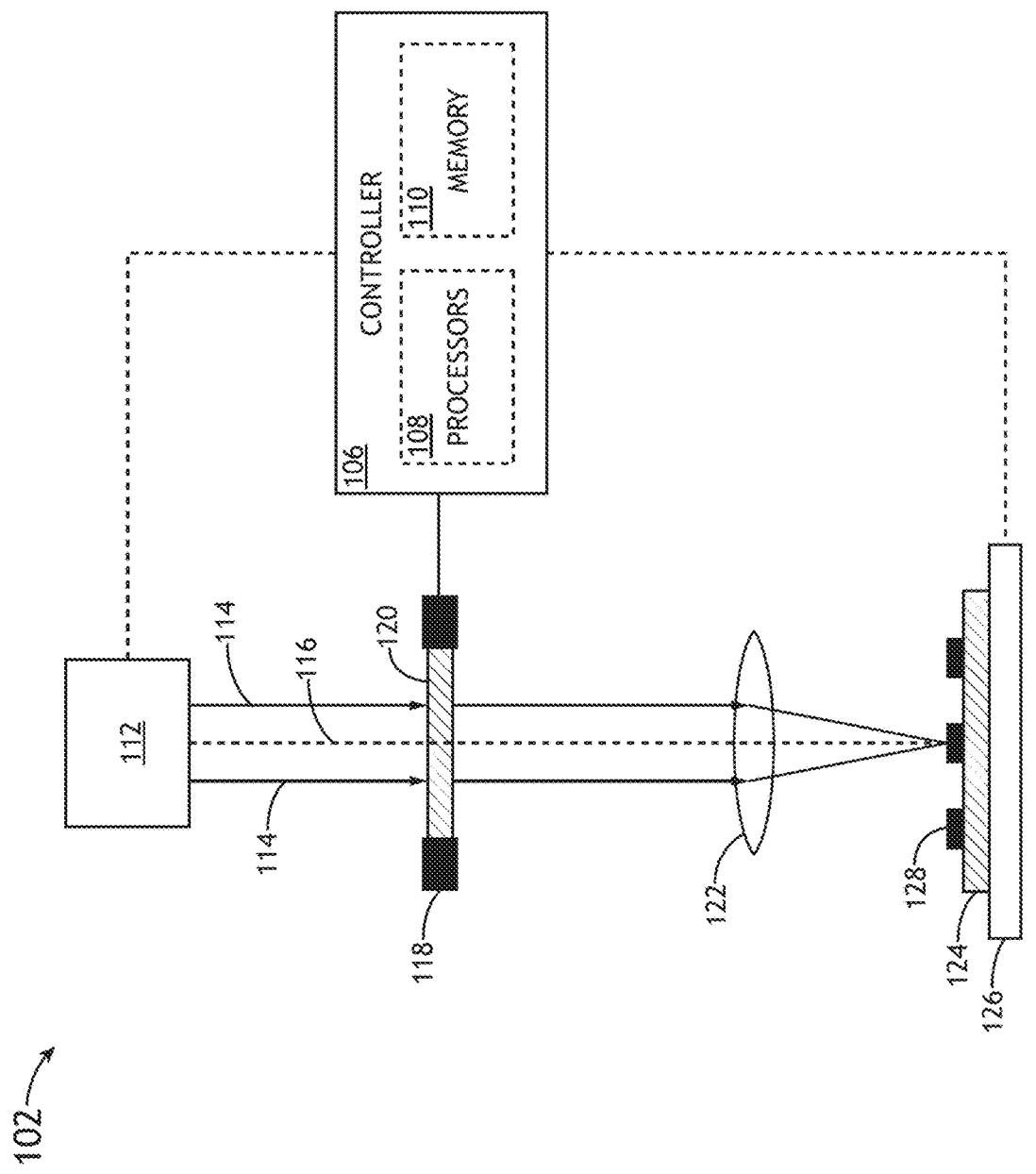
FIG. 1B is a simplified view illustrating a lithography sub-system of the fabrication system of FIG. 1A, in accordance with one or more embodiments of the present disclosure.
Figure 1C:
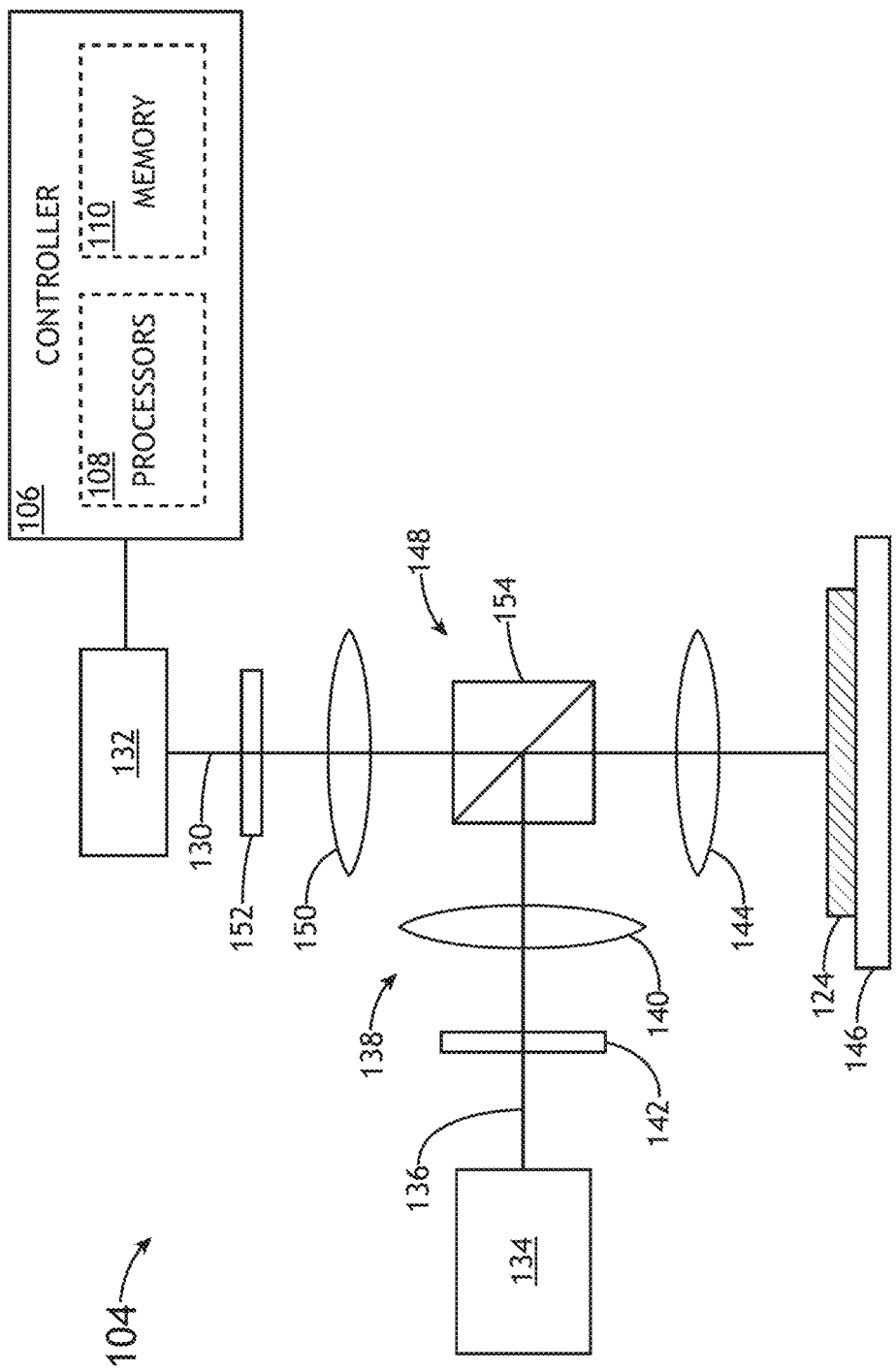
FIG. 1C is a simplified view of a metrology sub-system of the fabrication system of FIG. 1A, in accordance with one or more embodiments of the present disclosure.

FIGS. 1A-1C in general illustrate a system 100, in accordance with one or more embodiments of the present disclosure.

As illustrated in at least FIG. 1A, in one embodiment, the system 100 includes one or more lithography sub-systems 102 for lithographically imaging one or more pattern elements of a pattern mask (e.g., device pattern elements, metrology target pattern elements, or the like) on a sample. For the purposes of the present disclosure, it is noted herein that a lithography sub-system 102 may be referred to as a lithography tool. For example, the lithography sub-system 102 may include any lithographic tool known in the art including, but not limited to, an etcher, scanner, stepper, cleaner, or the like. A fabrication process may include fabricating multiple dies distributed across the surface of a sample (e.g., a semiconductor wafer, or the like), where each die includes multiple patterned layers of material forming a device component. Each patterned layer may be formed by lithography tools via a series of steps including material deposition, lithography, etching to generate a pattern of interest, and/or one or more exposure steps (e.g., performed by a scanner, a stepper, or the like). For purposes of the present disclosure, it is noted herein a lithography sub-system 102 may be a single lithography tool or may represent a group of lithography tools.

In another embodiment, the system 100 includes one or more metrology sub-systems 104 to characterize one or more features on the sample. The system 100 may incorporate metrology measurements at one or more points during a fabrication process to monitor and control the fabrication of features on a particular sample and/or across multiple samples. For the purposes of the present disclosure, it is noted herein that a metrology sub-system 104 may be referred to as a metrology tool. For example, the metrology sub-system 104 may include an overlay metrology tool suitable for measuring relative positions of features of a sample. In one embodiment, the metrology sub-system 104 includes an image-based metrology tool to measure metrology data based on the generation of one or more images of a sample. In another embodiment, the metrology sub-system 104 includes an electron beam-based metrology system. For example, the metrology sub-system 104 may include a scatterometry-based metrology system (e.g., a scatterometry overlay (SCOL) metrology system) to measure metrology data based on the scattering (reflection, diffraction, diffuse scattering, or the like) of light from the sample. For purposes of the present disclosure, it is noted herein a metrology sub-system 104 may be a single metrology tool or may represent a group of metrology tools.

In another embodiment, the system 100 includes a controller 106. The controller 106 may include one or more processors 108 configured to execute program instructions maintained on a memory medium 110. In this regard, the one or more processors 108 of controller 106 may execute any of the various process steps described throughout the present disclosure.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. In addition, the controller 106 may include one or more controllers housed in a common housing or within multiple housings. In this way, any controller or combination of controllers may be separately packaged as a module suitable for integration into system 100. Further, the controller 106 may analyze data received from a detector and feed the data to additional components within the system 100 (e.g., the lithography sub-system 102) or external to the system 100.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random-access memory, a magnetic or optical memory device (e.g., disk), a magnetic tape, a solid-state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

As illustrated in at least FIG. 1B, in one embodiment, the lithography sub-system 102 includes a lithography illumination source 112 configured to generate an illumination beam 114. The one or more illumination beams 114 may include one or more selected wavelengths of light including, but not limited to, ultraviolet (UV) radiation, visible radiation, or infrared (IR) radiation.

Illumination from the lithography illumination source 112 may have any spatial distribution (e.g., illumination pattern). For example, the lithography illumination source 112 may include, but is not limited to, a single-pole illumination source, a dipole illumination source, a C-Quad illumination source, a Quasar illumination source, or a free-form illumination source. In this regard, the lithography illumination source 112 may generate on-axis illumination beams 114 in which illumination propagates along (or parallel to) an optical axis 116 and/or any number of off-axis illumination beams 114 in which illumination propagates at an angle to the optical axis 116.

It is noted herein that, for the purposes of the present disclosure, an illumination pole of the lithography illumination source 112 may represent illumination from a specific location. In this regard, each spatial location of the lithography illumination source 112 (e.g., with respect to the optical axis 116) may be considered an illumination pole. Further, an illumination pole may have any shape or size known in the art. In addition, the lithography illumination source 112 may be considered to have an illumination profile corresponding to a distribution of illumination poles.

Further, the lithography illumination source 112 may generate the illumination beams 114 by any method known in the art. For example, an illumination beam 114 may be formed as illumination from an illumination pole of the lithography illumination source 112 (e.g., a portion of an illumination profile of a lithography illumination source 112, or the like). By way of another example, lithography illumination source 112 may include multiple illumination sources for the generation of multiple illumination beams 114.

In another embodiment, the lithography sub-system 102 includes a mask support device 118. The mask support device 118 is configured to secure a pattern mask 120. In another embodiment, the lithography sub-system 102 includes a set of projection optics 122 configured to project an image of the pattern mask 120 illuminated by the one or more illumination beams 114 onto a sample 124 disposed on a sample stage 126 in order to generate printed pattern elements corresponding to the image of the pattern mask 120. In another embodiment, the mask support device 118 may be configured to actuate or position the pattern mask 120. For example, the mask support device 118 may actuate the pattern mask 120 to a selected position with respect to the projection optics 122 of the system 100.

The sample 124 may include any number of photosensitive materials and/or material layers suitable for receiving the image of the pattern mask 120. For example, the sample 124 may include a resist layer 128. In this regard, the set of projection optics 122 may project an image of the pattern mask 120 onto the resist layer 128 to expose the resist layer 128 and a subsequent etching step may remove the exposed material (e.g., positive etching) or the unexposed material (e.g., negative etching) in order to provide printed features on the sample 124. Further, the pattern mask 120 may be utilized in any imaging configuration known in the art. For example, the pattern mask 120 may be a positive mask (e.g., a bright-field mask) in which pattern elements are positively imaged as printed pattern elements. By way of another example, the pattern mask 120 may be a negative mask (e.g., a dark-field mask) in which pattern elements of the pattern mask 120 form negative printed pattern elements (e.g., gaps, spaces, or the like).

The controller 106 may be communicatively coupled to any element or combination of elements in the lithography sub-system 102 including, but not limited to, the mask support device 118 and/or the sample stage 126 to direct the transfer of pattern elements on a pattern mask 120 to a sample 124, the lithography illumination source 112 to control one or more characteristics of the illumination beam 114.

FIG. 1C is a block diagram view of the metrology sub-system 104, in accordance with one or more embodiments of the present disclosure. The system 100 may generate one or more images associated with light emanating from the sample 124 (e.g., sample light 130) on at least one detector 132 using any method known in the art. In one embodiment, the detector 132 is located at a field plane to generate an image of one or more features on the sample 124. In this regard, the system 100 may operate as an image-based overlay metrology tool. In another embodiment, the detector 132 is located at a pupil plane to generate an image based on angles of light emanating from the sample 124 (e.g., based on reflection, diffraction, scattering, or the like). In this regard, the system 100 may operate as a scatterometry-based metrology tool.

In one embodiment, the metrology sub-system 104 includes a metrology illumination source 134 to generate a metrology illumination beam 136. The metrology illumination source 134 may be the same as the lithography illumination source 112 or may be a separate illumination source configured to generate a separate metrology illumination beam 136. The metrology illumination beam 136 may include one or more selected wavelengths of light including, but not limited to, vacuum ultraviolet (VUV) radiation, deep ultraviolet (DUV) radiation, ultraviolet (UV) radiation, visible radiation, or infrared (IR) radiation. The metrology illumination source 134 may further generate a metrology illumination beam 136 including any range of selected wavelengths. In another embodiment, the metrology illumination source 134 may include a spectrally-tunable illumination source to generate a metrology illumination beam 136 having a tunable spectrum.

The metrology illumination source 134 may further produce a metrology illumination beam 136 having any temporal profile. For example, the metrology illumination source 134 may produce a continuous metrology illumination beam 136, a pulsed metrology illumination beam 136, or a modulated metrology illumination beam 136. In addition, the metrology illumination beam 136 may be delivered from the metrology illumination source 134 via free-space propagation or guided light (e.g., an optical fiber, a light pipe, or the like).

In another embodiment, the metrology illumination source 134 directs the metrology illumination beam 136 to the sample 124 via an illumination pathway 138. The illumination pathway 138 may include one or more lenses 140 or additional illumination optical components 142 suitable for modifying and/or conditioning the metrology illumination beam 136. For example, the one or more illumination optical components 142 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 142 may include aperture stops to control the angle of illumination on the sample 124 and/or field stops to control the spatial extent of illumination on the sample 124. In one instance, the illumination pathway 138 includes an aperture stop located at a plane conjugate to the back focal plane of an objective lens 144 to provide telecentric illumination of the sample. In another embodiment, the system 100 includes an objective lens 144 to focus the metrology illumination beam 136 onto the sample 124.

In another embodiment, the sample 124 is disposed on a sample stage 146. The sample stage 146 may include any device suitable for positioning the sample 124 within the system 100. For example, the sample stage 146 may include any combination of linear translation stages, rotational stages, tip/tilt stages, or the like.

For purposes of the present disclosure, in some embodiments the sample 124 may be considered a metrology sample 124.

In another embodiment, a detector 132 is configured to capture radiation emanating from the sample 124 (e.g., sample light 130) through a collection pathway 148. For example, the collection pathway 148 may include, but is not required to include, a collection lens (e.g., the objective lens 144 as illustrated in FIG. 1C) or one or more additional collection pathway lenses 150. In this regard, a detector 132 may receive radiation reflected or scattered (e.g., via specular reflection, diffuse reflection, and the like) from the sample 124 or generated by the sample 124 (e.g., luminescence associated with absorption of the metrology illumination beam 136, or the like).

The collection pathway 148 may further include any number of collection optical components 152 to direct and/or modify illumination collected by the objective lens 144 including, but not limited to, one or more collection pathway lenses 150, one or more filters, one or more polarizers, or one or more beam blocks. In addition, the collection pathway 148 may include field stops to control the spatial extent of the sample imaged onto the detector 132 or aperture stops to control the angular extent of illumination from the sample used to generate an image on the detector 132. In another embodiment, the collection pathway 148 includes an aperture stop located in a plane conjugate to the back focal plane of the objective lens 144 to provide telecentric imaging of the sample.

The detector 132 may include any type of optical detector known in the art suitable for measuring illumination received from the sample 124. For example, a detector 132 may include a sensor suitable for generating one or more images of a static sample 124 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. By way of another example, a detector 132 may include a sensor suitable for generating one or more images of a sample 124 in motion (e.g., a scanning mode of operation) including, but not limited to, a line sensor or a time delay and integration (TDI) sensor.

In another embodiment, a detector 132 may include a spectroscopic detector suitable for identifying wavelengths of radiation emanating from the sample 124. In another embodiment, the system 100 may include multiple detectors 132 (e.g., associated with multiple beam paths generated by one or more beamsplitters) to facilitate multiple metrology measurements by the system 100.

In one embodiment, the system 100 includes a beamsplitter 154 oriented such that the objective lens 144 may simultaneously direct the metrology illumination beam 136 to the sample 124 and collect radiation emanating from the sample 124. In this regard, the system 100 may be configured in an epi-illumination mode.

In another embodiment, as illustrated in FIGS. 1A-1C, the controller 106 is communicatively coupled to one or more elements of the system 100. In this regard, the controller 106 may transmit and/or receive data from any component of the system 100. For example, the controller 106 may be configured to receive data including, but not limited to, one or more images from the detector 132 of the sample 124.

In one embodiment, the sample 124 may be designed and/or fabricated to be used for the error reduction systems and methods described throughout the present disclosure.

FIGS. 2-5B in general illustrate an embodiment of the present disclosure directed to a system and method for error reduction in metrology measurements, in accordance with the present disclosure.

In one embodiment, the sample 124 includes one or more fields 200. Each field 200 of the one or more fields 200 includes one or more overlay metrology targets. For purposes of the present disclosure, it is noted herein that overlay metrology targets may be referred to as metrology targets or overlay targets.

Figure 2:
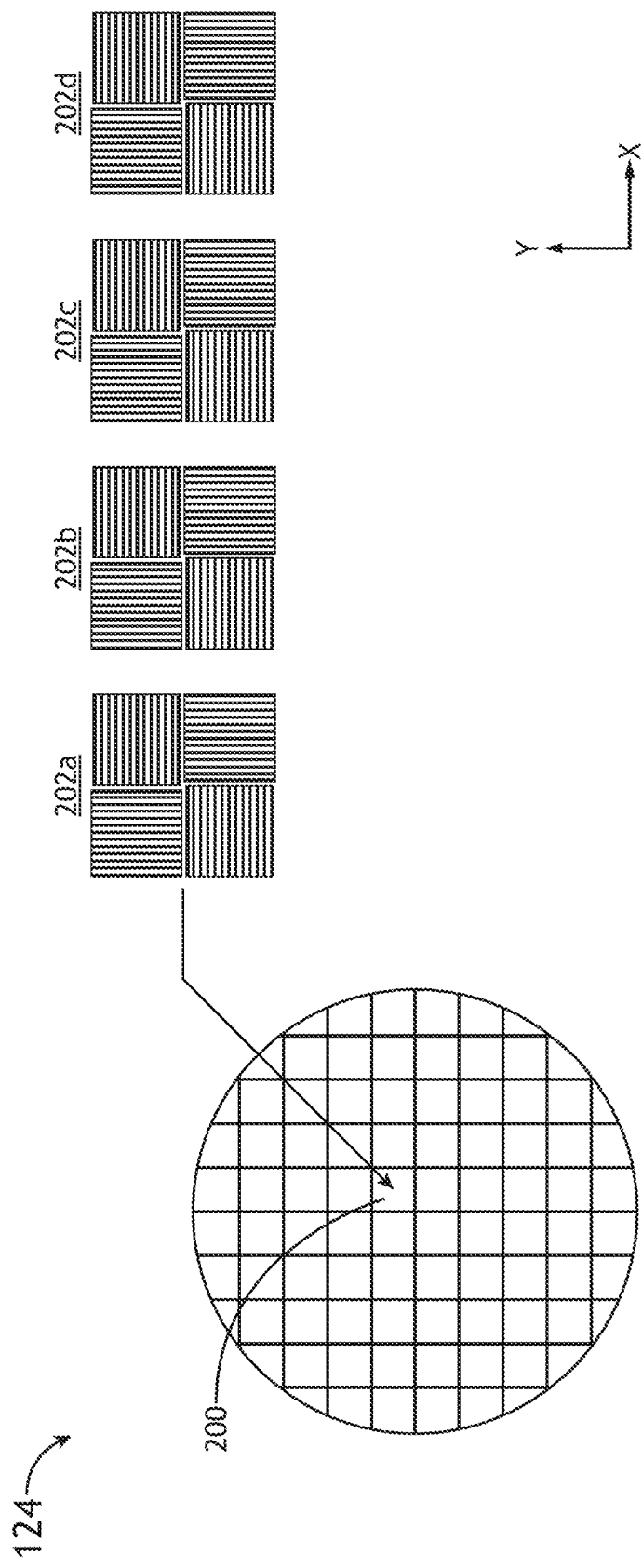
FIG. 2 illustrates scatterometry overlay (SCOL) metrology targets in an array of fields on a sample, in accordance with one or more embodiments of the present disclosure.

For example, as illustrated in FIG. 2, a sample 124 may include four metrology targets 202a-202d for scatterometry technology. The one or more metrology targets may be of different types, such that different metrology targets have different target designs. The four metrology targets 202a-202d may be allocated near one another on the sample 124, but may be different in one or more of critical dimension (CD), pitch, and/or segmentation size. The four metrology targets 202a-202d may be located in several locations per field 200 on each field 200 of the sample 124, such that a total number of locations of metrology targets 200-200d may be up to several thousand locations. In one non-limiting example of the illustration in FIG. 2, each field 200 may be 5 nanometers (nm) in length or width.

Figure 3:
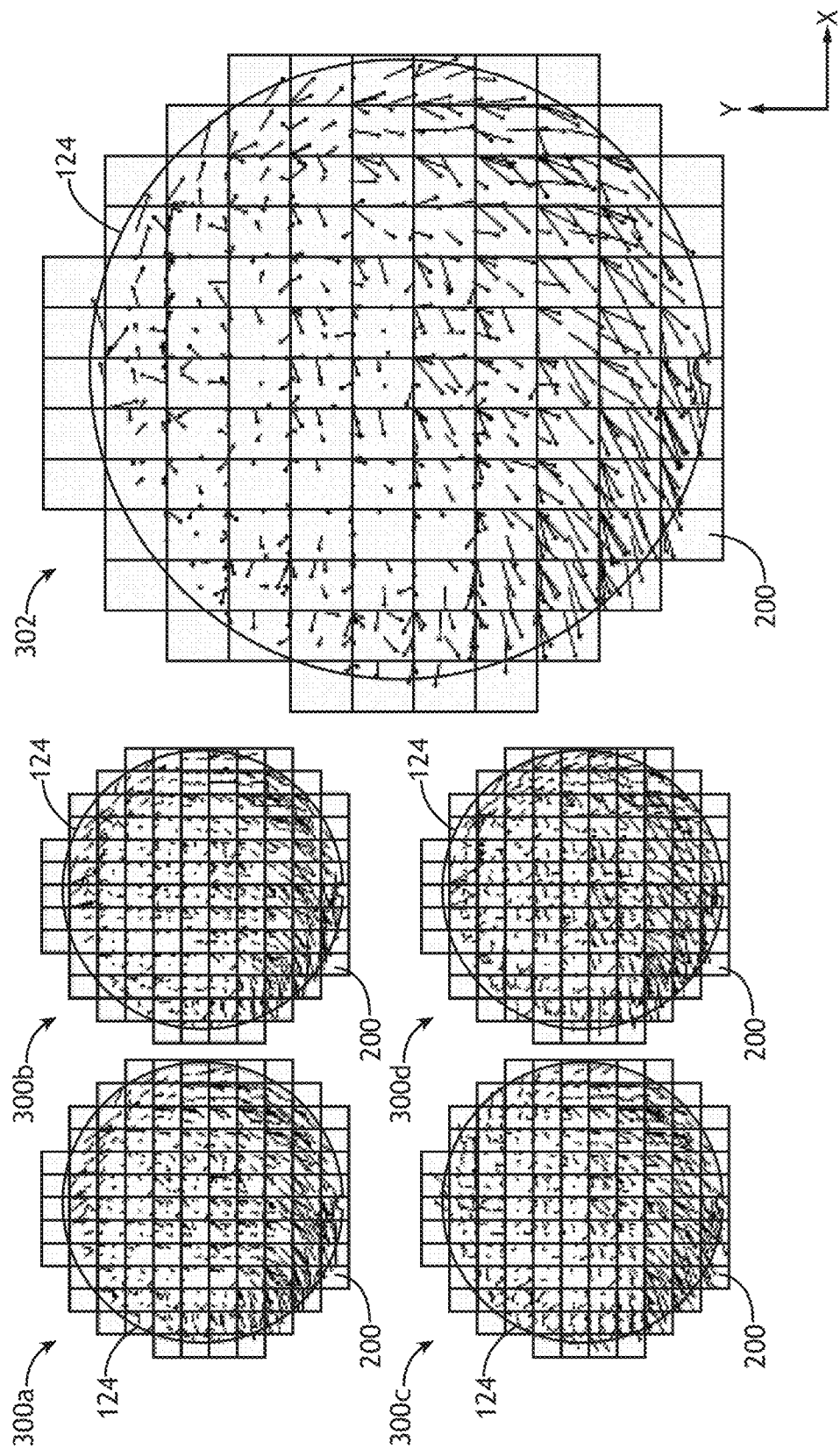
FIG. 3 illustrates overlay measurement maps of SCOL metrology targets and a combined overlay map, in accordance with one or more embodiments of the present disclosure.

FIG. 3 illustrates a series of measurement maps of the overlay measurements 300a-300d and metrics for each metrology target 202a-202d, respectively, in accordance with one or more embodiments of the present disclosure. The overlay measurements 300a-300d may be combined into a single overlay value 302. For example, the combined or single overlay value 302 may be determined using an averaging method, as provided in EQ. 1, where i=a location of a particular overlay target within a field 200 on the sample 124:

$$OVL_i^{302} = \frac{OVL_i^{300a} + OVL_i^{300b} + OVL_i^{300c} + OVL_i^{300d}}{4} \quad \text{EQ. 1}$$

By way of another example, the combined or single overlay value 302 may be determined using different weighted averages (e.g., where weighting may be generated using metrology target quality), a machine learning algorithm, and/or other algorithmic-based methodology.

FIG. 4 illustrates a table 400 of overlay measurements of SCOL metrology targets, in accordance with one or more embodiments of the present disclosure. In table 400, the combined or single overlay value 302 has been determined for the overlay measurements 300a-300d of the four metrology targets 202a-202d. The overlay 402 (in nm) in the x- and y-directions is provided for each of the overlay measurements 300a-300d of the four metrology targets 202a-202d. The residual 404 (in nm) in the x- and y-directions is provided for each of the overlay measurements 300a-300d of the four metrology targets 202a-202d. A residual improvement 406 (expressed as a percentage) using the combined or single overlay value 302 in the x- and y-directions is provided for each of the overlay measurements 300a-300d of the four metrology targets 202a-202d.

Figure 5A:
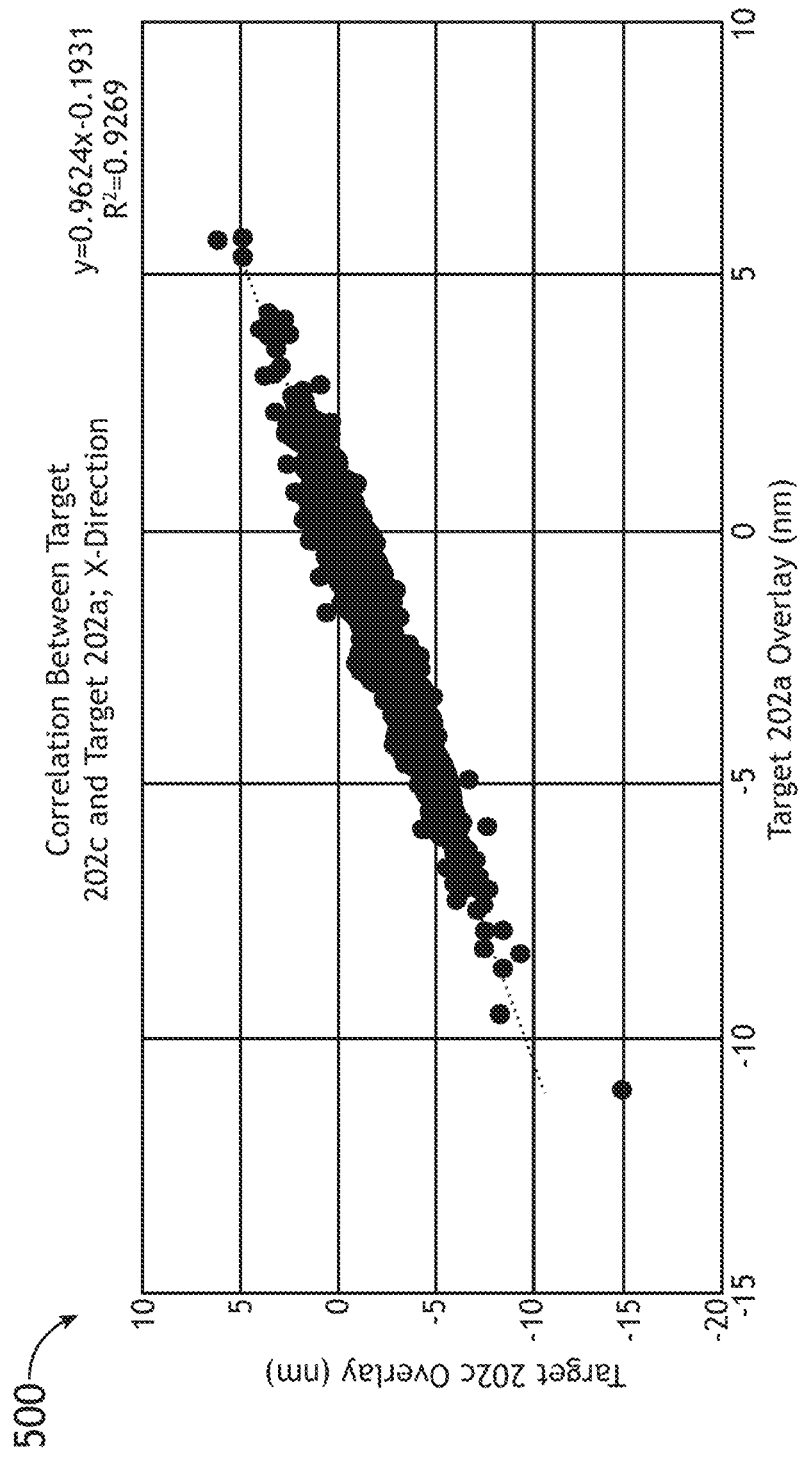
FIG. 5A illustrates a graph comparing overlay measurements of two SCOL metrology targets, in accordance with one or more embodiments of the present disclosure.
Figure 5B:
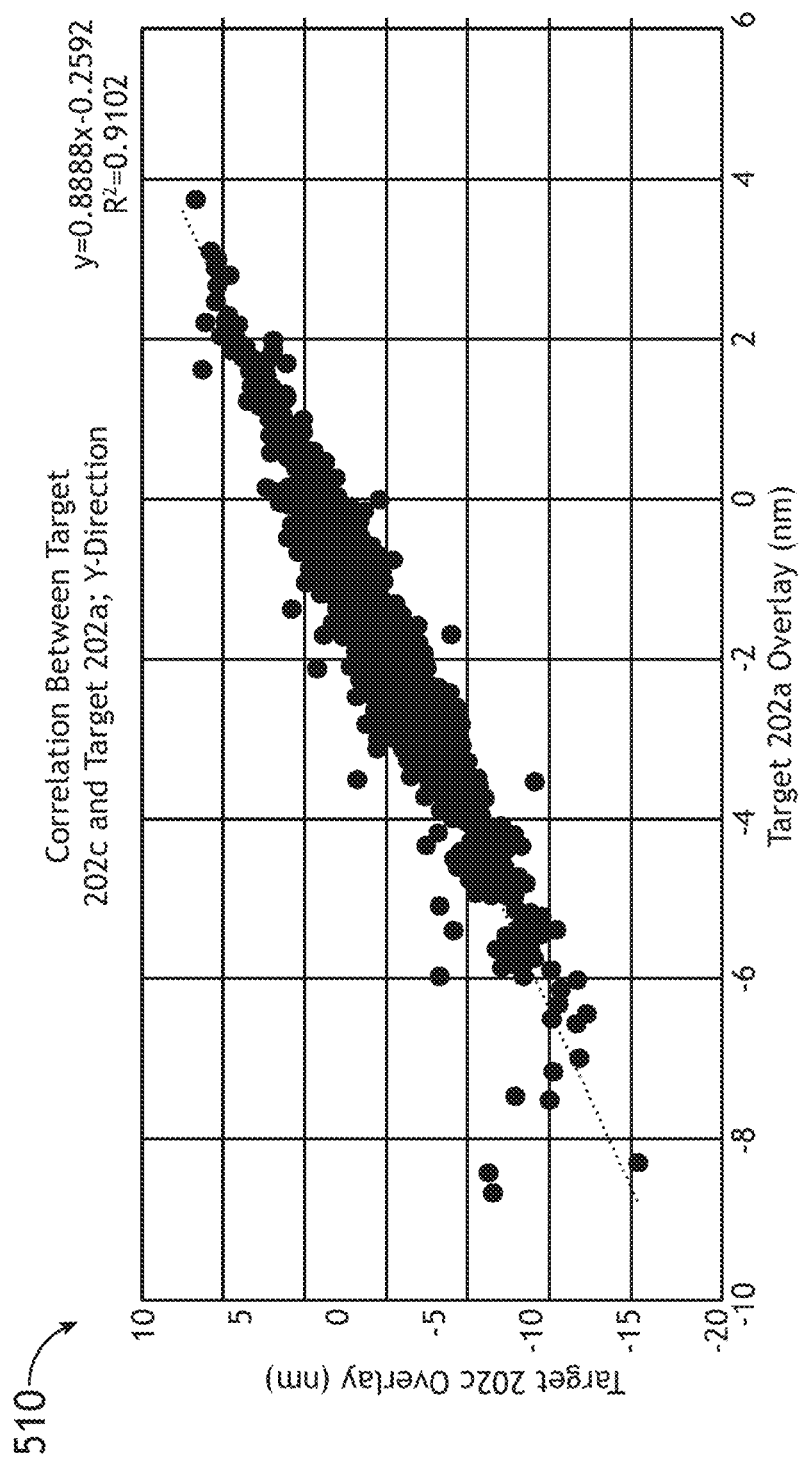
FIG. 5B illustrates a graph comparing overlay measurements of two SCOL metrology targets, in accordance with one or more embodiments of the present disclosure.

FIGS. 5A and 5B illustrate graphs comparing overlay measurements 300a, 300c of metrology targets 202a, 202c, respectively, in accordance with one or more embodiments of the present disclosure.

Using multiple metrology target measurements taken from overlay targets with multiple target designs may require the use of a best metrology tool recipe per metrology target type for generating a good overlay correlation between the different metrology targets. For example, graph 500 correlates overlay for target 202c versus target 202a in the x-direction. By way of another example, graph 510 correlates overlay for target 202c versus target 202a in the y-direction.

It is noted herein the combined or single overlay value 302 may reduce noise originating from one or more sources of errors including, but not limited to, process variations, lithography processes, and metrology processes. For example, the one or more sources of errors may stem from a lithography flow and include, but are not limited to, mask printability errors, lithography tool errors, process tool errors (e.g., etchers, cleaners, or the like), and metrology tool errors. The combined or single overlay value 302 may be used to set a quality index for each overlay measurement 300a-300d. The combined or single overlay value 302 may be used to disqualify one or more of the overlay measurements 300a-300d due to low performance. The combined or single overlay value 302 may improve weighting-based algorithms which use accuracy flags (e.g., including, but not limited to, sensitivity, pupil information, contrast information or other metrics usable for indicating an accuracy of a measurement), and/or metadynamics (MTD) simulations information.

Although this embodiment of the present disclosure is directed to multiple metrology targets of different types, such that different metrology targets have different target designs, it is noted herein that the system and method above may also be used with multiple metrology targets of a single type, such that all metrology targets have the same or similar target design (e.g., in some cases, an identical target design). Therefore, the above description should not be interpreted as a limitation on the present disclosure but merely an illustration.

FIGS. 6-11D in general illustrate a system and method for error reduction in metrology measurements, in accordance with one or more embodiments of the present disclosure.

Figure 6:
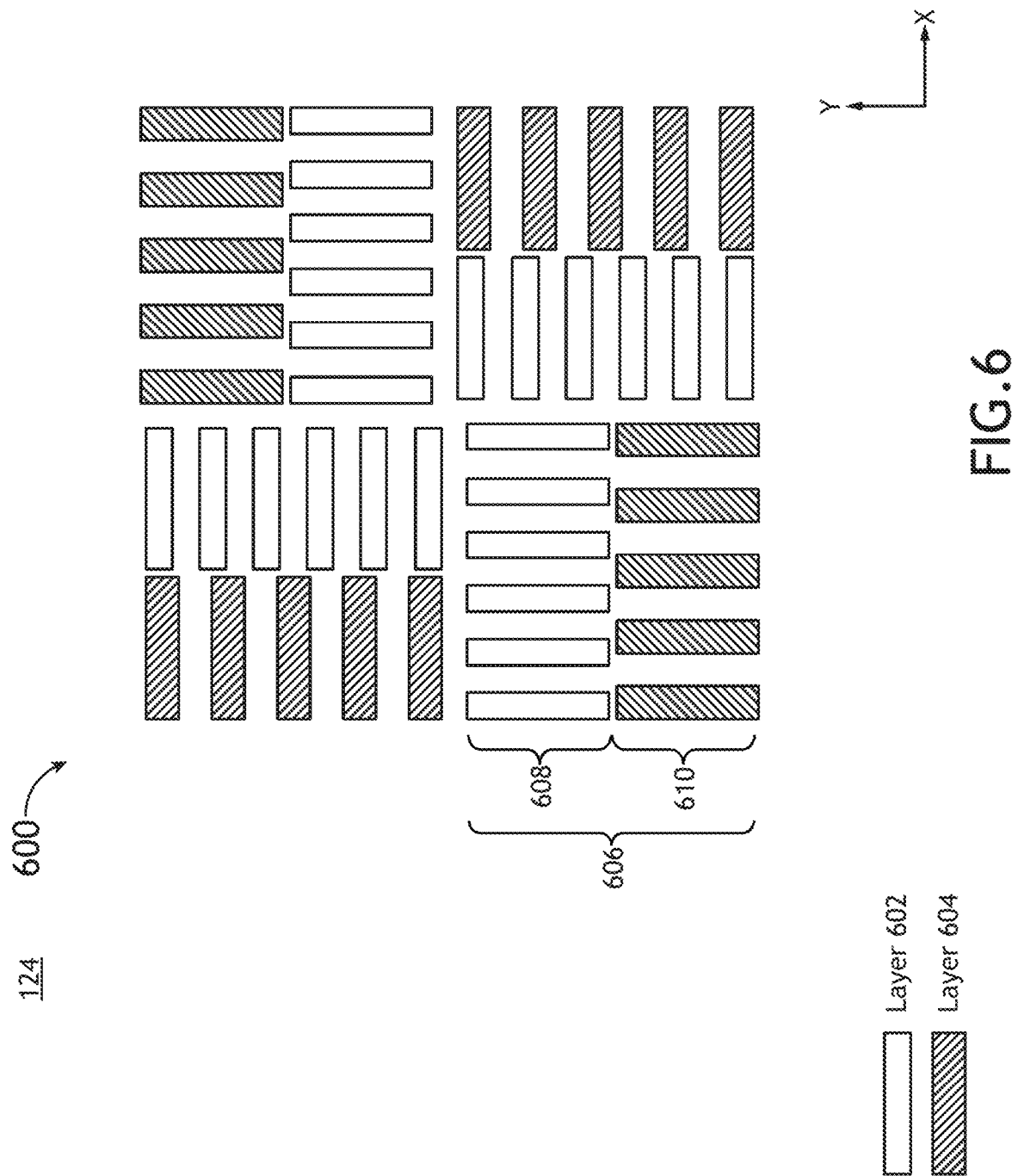
FIG. 6 illustrates an advanced imaging metrology (AIM) target, in accordance with one or more embodiments of the present disclosure.

FIG. 6 illustrates an advanced imaging metrology (AIM) target 600. The AIM target 600 may be combined from a grating representing a current layer 602 (e.g., including, but not limited to, a resist layer) and a grating representing a previous layer 604 (e.g., including, but not limited to, a process layer).

The AIM target 600 may include multiple cells 606. For example, the AIM target 600 may include four cells 606. The current layer 602 and the previous layer 604 may be separated into sections or portions 608, 610 respectively within a particular cell 606 of the AIM target 600. It is noted herein, however, the current layer 602 and the previous layer 604 may be dispersed throughout the particular cell 606 of the AIM target 600.

Figure 7:
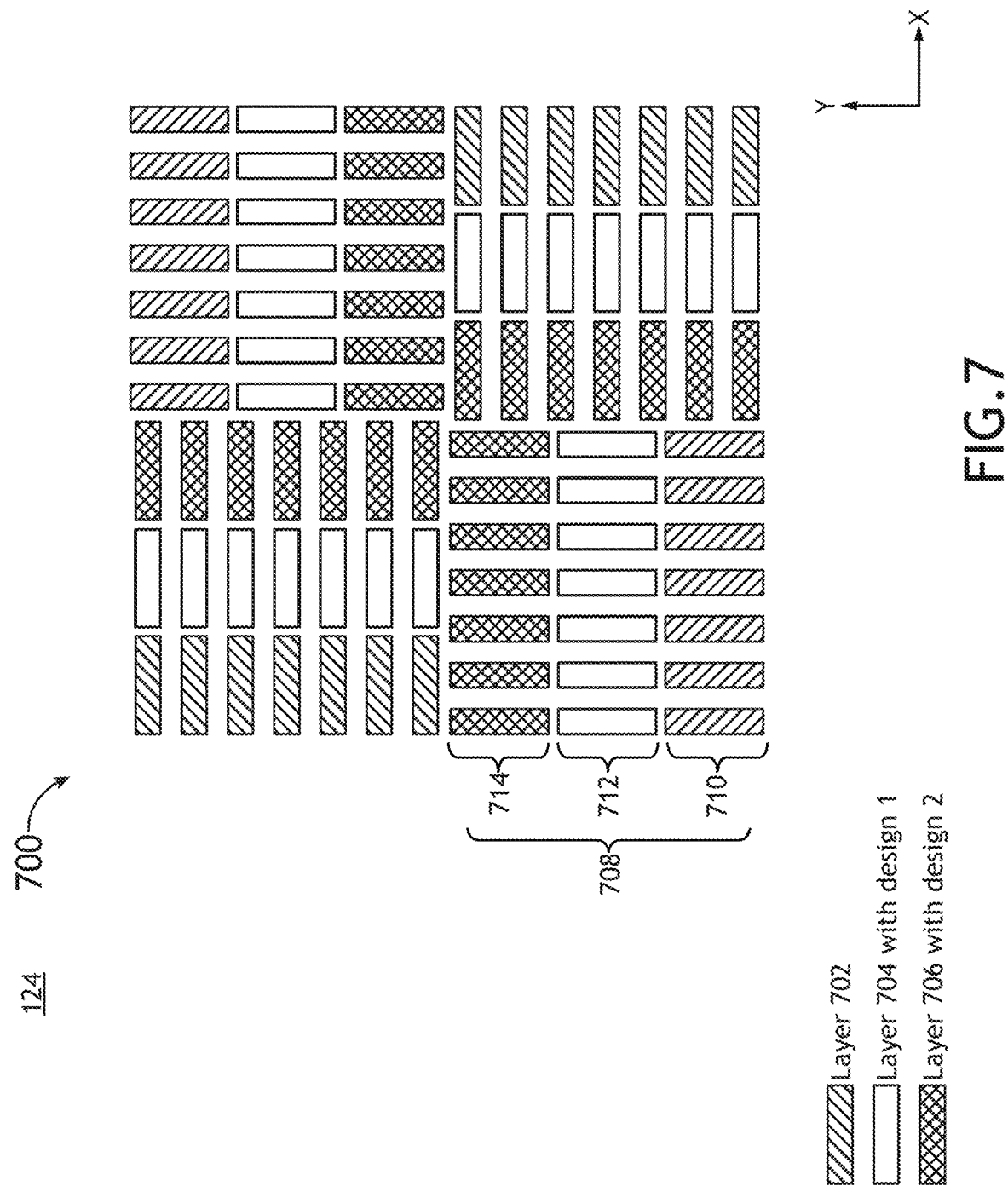
FIG. 7 illustrates a triple AIM target, in accordance with one or more embodiments of the present disclosure.

FIG. 7 illustrates a triple AIM target 700. The triple AIM target 700 may be a triple target design combined from a grating representing a current layer 702 (e.g., including, but not limited to, a resist layer), a grating representing a first previous layer 704 (e.g., including, but not limited to, a first process layer), and a grating representing a second previous layer 706 (e.g., including, but not limited to, a second process layer). The grating for the first previous layer 704 and the grating for the second previous layer 706 may be generated with different metrology target designs. For example, the metrology target designs may differ in critical dimension (CD), pitch, and/or segmentation size. In this regard, the triple AIM target 700 may be constructed from two different metrology target designs. It is noted herein, however, that the grating for the first previous layer 704 and the grating for the second previous layer 706 may be generated with a same or similar metrology target design.

The AIM target 700 may include multiple cells 708. For example, the AIM target 700 may include four cells 708. The current layer 702 and the previous layers 704, 706 may be separated into sections or portions 710, 712, 714 respectively within a particular cell 708 of the AIM target 700. It is noted herein, however, the current layer 702 and the previous layers 704, 706 may be dispersed throughout the particular cell 708 of the AIM target 700.

Figure 8:
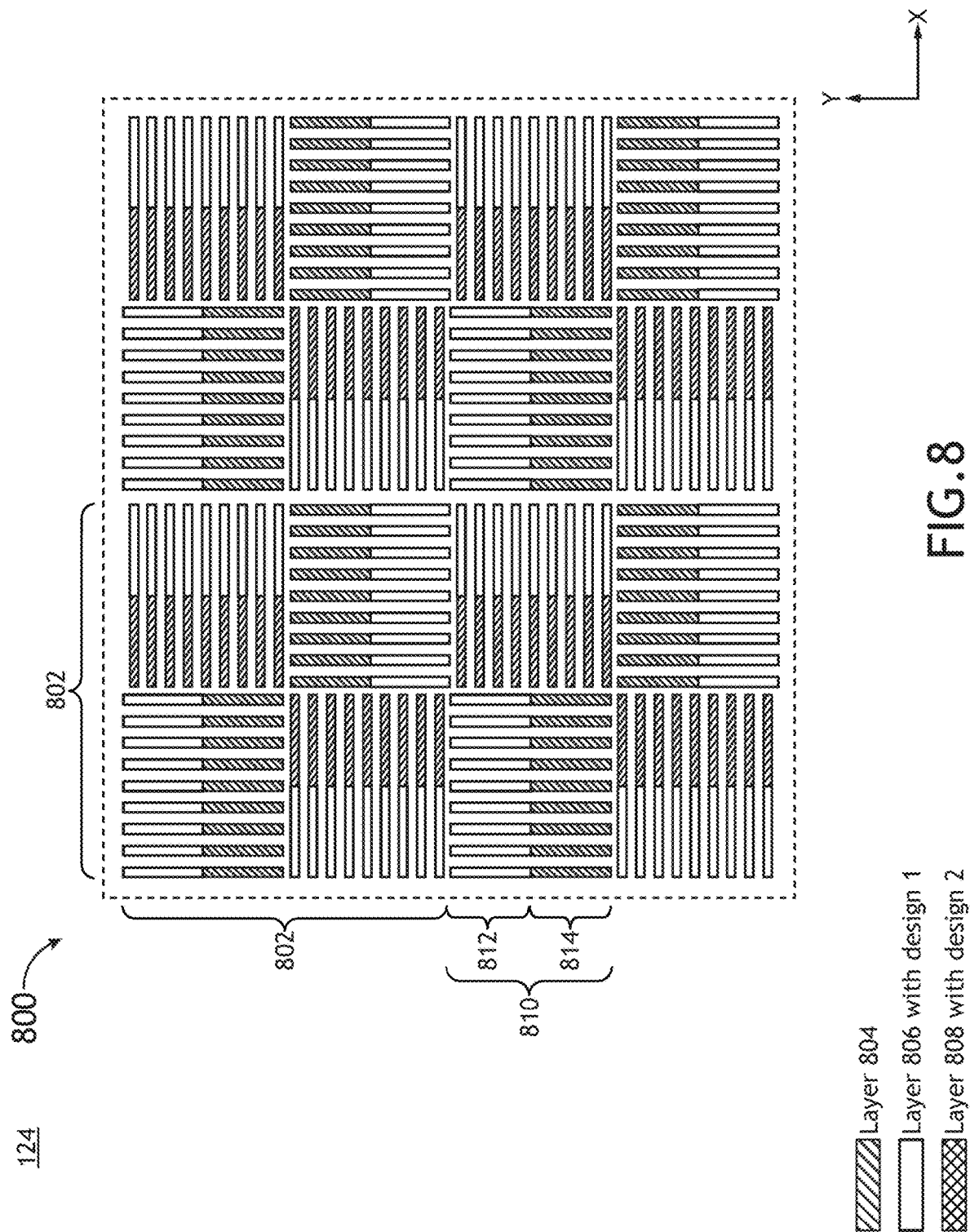
FIG. 8 illustrates a triple AIM target, in accordance with one or more embodiments of the present disclosure.

FIG. 8 illustrates a triple AIM target 800. The triple AIM target 800 may include several types of AIM targets 802. For example, the triple AIM target 800 may include four AIM targets 802. The triple AIM target 800 may be a triple target design combined from a grating representing a current layer 804 (e.g., including, but not limited to, a resist layer), a grating representing a first previous layer 806 (e.g., including, but not limited to, a first process layer), and a grating representing a second previous layer 808 (e.g., including, but not limited to, a second process layer). The grating for the first previous layer 806 and the grating for the second previous layer 808 may be generated with different metrology target designs. For example, the AIM targets 802 may include different types with differing design target parameters including, but not limited to, pitch, CD, segmentation size, induced overlay ((OVL) FO), or the like (e.g., a Design of Experiment). In general, the AIM targets 802 may include two, three, four . . . up to an N number of types. It is noted herein, however, the AIM targets 802 may all be a same or similar type with a same or similar target design, such that the grating for the first previous layer 806 and the grating for the second previous layer 808 may be generated from the same or similar target design (e.g., in some cases, an identical target design).

The AIM target 802 may include multiple cells 810. For example, an AIM target 802 may include four cells 810. The current layer 804 and the previous layers 806, 808 may be separated into sections or portions 812, 814 respectively within a particular cell 810 of the AIM target 802. It is noted herein, however, the current layer 804 and the previous layers 806, 808 may be dispersed throughout the particular cell 810 of the AIM target 802.

Figure 9:
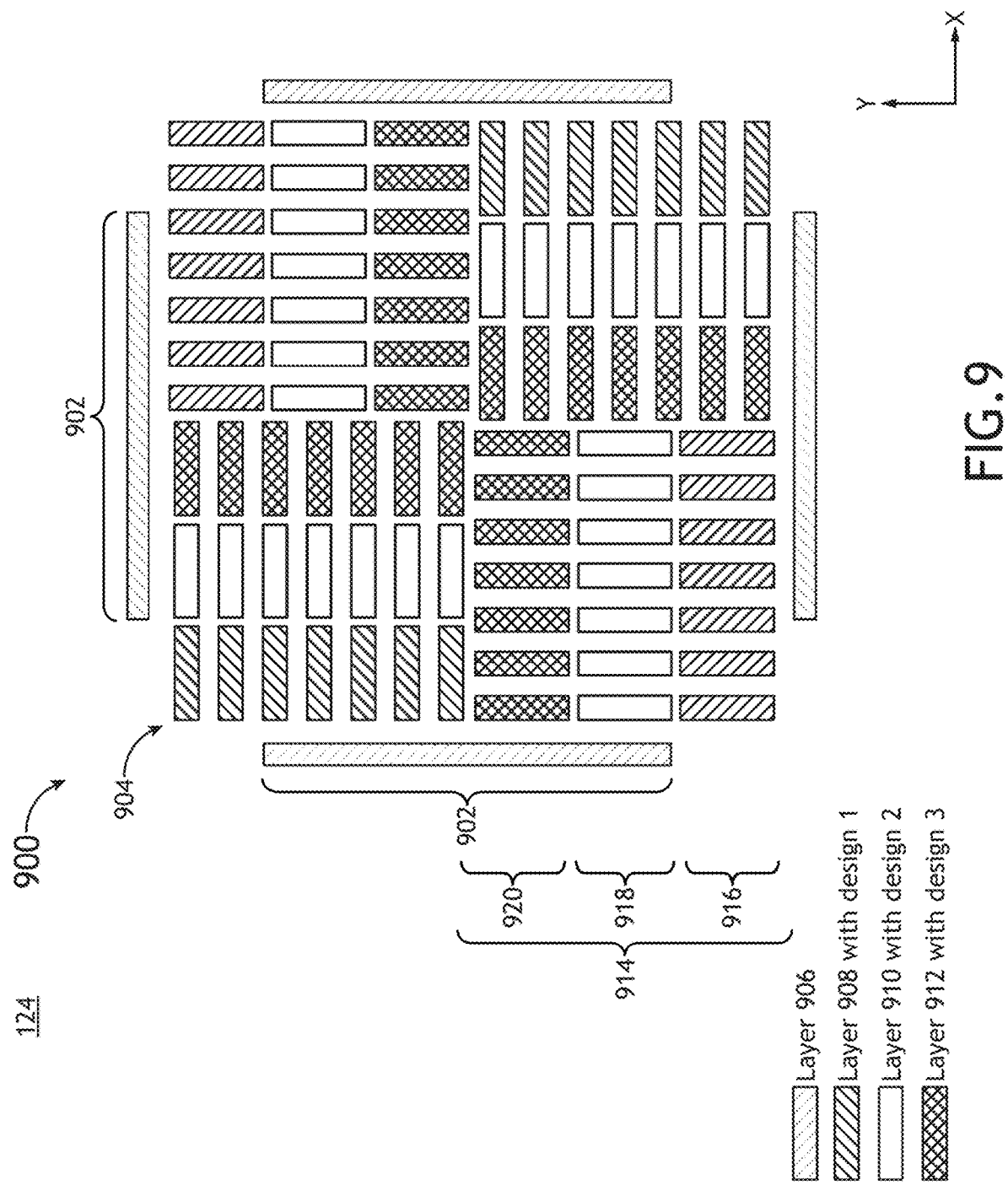
FIG. 9 illustrates a triple AIM target, in accordance with one or more embodiments of the present disclosure.

FIG. 9 illustrates a triple AIM target 900. The triple AIM target 900 may include a combination of a box in box target design 902 and an AIM target design 904. The box in box target design 902 may include a box frame representing a current layer 906 (e.g., including, but not limited to, a resist layer). The AIM target design 904 may be a triple target design combined from a grating representing a first previous layer 908 (e.g., including, but not limited to, a first process layer), a grating representing a second previous layer 910 (e.g., including, but not limited to, a second process layer), and a grating representing a third previous layer 912 (e.g., including, but not limited to, a third process layer). The grating for the first previous layer 908, the grating for the second previous layer 910, and the grating for the third previous layer 912 may be generated with different metrology target designs. For example, the AIM target design 904 may include different types with differing design target parameters including, but not limited to, pitch, CD, segmentation size, induced overlay ((OVL) FO), or the like (e.g., a Design of Experiment). In general, the AIM target design 904 may include two, three, four . . . up to an N number of types. It is noted herein, however, the AIM target design 904 may all be a same or similar type with a same or similar target design, such that the grating for the first previous layer 908, the grating for the second previous layer 910, and the grating for the third previous layer 912 may be generated from the same or similar target design (e.g., in some cases, an identical target design).

Although the triple AIM target 900 is illustrated as the box in box target design 902 representing the current layer 906 surrounding the AIM target design 904 representing previous layers 908, 910, 912, it is noted herein the triple AIM target 900 may be reconfigured to have the box in box target design 902 representing a previous layer (e.g., a process layer) surrounding the AIM target design 904 representing a current layer (e.g., including, but not limited to, a resist layer). Therefore, the above description should not be interpreted as a limitation on the present disclosure but merely an illustration.

The AIM target 900 may include multiple cells 914. For example, an AIM target 900 may include four cells 914. The previous layers 908, 910, 912 may be separated into sections or portions 916, 918, 920 respectively within a particular cell 914 of the AIM target 802. It is noted herein, however, the previous layers 908, 910, 912 may be dispersed throughout the particular cell 914 of the AIM target 900.

Figure 10:
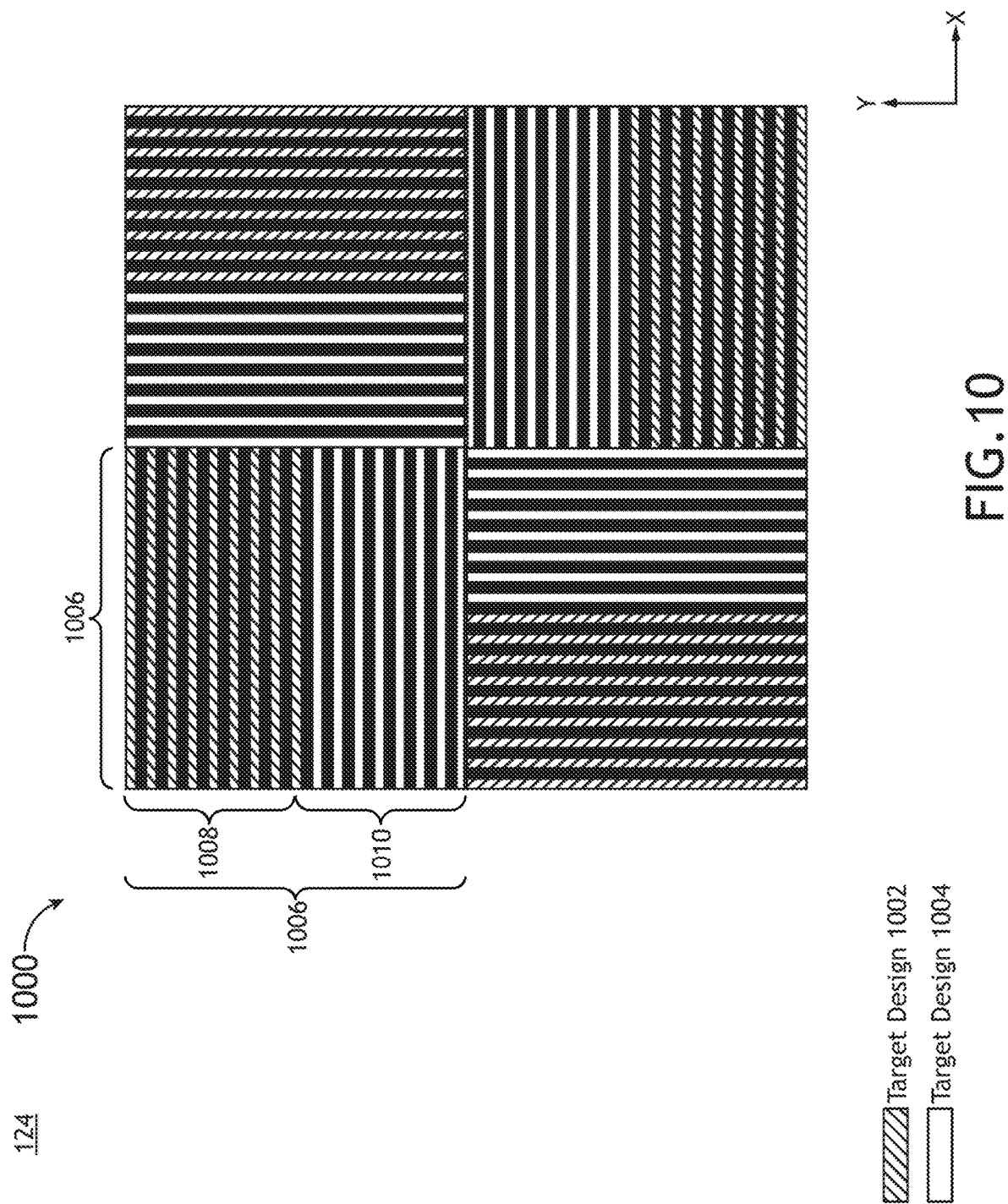
FIG. 10 illustrates a multi-cell SCOL target, in accordance with one or more embodiments of the present disclosure.

FIG. 10 illustrates a SCOL target 1000. The SCOL target 1000 may include a first target design 1002 and a second target design 1004. The first target design 1002 and the second target design 1004 may each be on the same set of layers of the SCOL target 1000 within a particular cell 1006 of the SCOL target 1000. The first target design 1002 may be separated from the second target design 1004 into sections or portions 1008, 1010 respectively within the particular cell 1006 of the SCOL target 1000. It is noted herein, however, the first target design 1002 and the second target design 1004 may be dispersed throughout the particular cell 1006 of the SCOL target 1000.

The first target design 1002 and the second target design 1004 may include multiple cells 1006, where each of the multiple cells 1006 may be oriented in a particular direction. The SCOL target 1000 may be not limited to the same or similar design in an X-direction or a Y-direction, and instead a combination of different designs per direction may be used. For example, as illustrated in FIG. 10, the SCOL target 1000 may include four different target designs, dependent on the direction of orientation with respect to an x-direction and a y-direction. It is noted herein, however, the first target design 1002 and the second target design 1004 may be a same or similar target design (e.g., in some cases, an identical target design) in all of the multiple cells 1006 within a particular direction.

It is noted herein the first target design 1002 and the second target design 1004 may be used to improve an overlay prediction for reducing residuals and improve accuracy.

In general, the embodiments of the present disclosure directed to a noise reduction methodology for both the overlay target measurements (e.g., as illustrated in at least FIGS. 2-5B) and the target design (e.g., as illustrated in at least FIGS. 6-11D) may be used similarly on all target site locations on a sample (e.g., the sample 124) or per target site location or zone (e.g., cells, sections or portions, or the like) of target site locations. For example, a single metrology measurement may be used nearer to a center of the sample, as the center of the sample may be less sensitive to process variations. By way of another example, multiple metrology measurements may be used nearer to an end of the sample, as the end of the sample may be more sensitive to process variations. In this regard, the speed by which the overlay target measurements are performed may be increased.

It is noted herein a particular target design for a metrology target may improve metrology targets and measurement conditions that have an opposite response to given process variations. The particular target design may reduce specific residual root causes (e.g., including, but not limited to, inaccuracy types, target noise types, or the like). The particular target design may also include cells with better Non Zero Offset (NZO) tracking (e.g., segmented or Moire cells), where NZO may represent an amount of bias between a metrology target and a device. The particular target design may also include cells with less process variation sensitivity (e.g., unsegmented cells). As such, a model may be generated based on the cells with better NZO tracking and residuals may be tracked from the model according to the cells with less process variation sensitivity.

It is noted herein the multi-target approach may not add a throughput penalty due to the availability of dual illumination and collection channels in imaging and scatterometry base technology systems.

FIGS. 11A-11D in general illustrate a system and method for error reduction in metrology measurements, in accordance with one or more embodiments of the present disclosure.

A sample may include a metrology target 1100. The metrology target 1100 may include one or more cells 1102. A cell 1102 may include multiple pitch values. For example, the cell 1102 may include a POR pitch value. By way of another example, the cell 1102 may include a smaller pitch value. By way of another example, the cell 1102 may include a larger pitch value. The inclusion of multiple pitch values may depend on an area available of the wafer or sample for metrology targets.

As illustrated in FIG. 11B, in one example a cell 1102 may include a plan of record (POR) pitch 1104 for a first overlay value $OVL_{1104}$. The cell 1102 may include a ½× (or half) segmentation size pitch 1106 for a second overlay value $OVL_{1106}$. The cell 1102 may include a 2× (or double) segmentation size pitch 1108 for a third overlay value $OVL_{1108}$.

The overlay measurements $OVL_{1104}$, $OVL_{1106}$, $OVL_{1108}$ and metrics for the pitches 1104, 1106, 1108, respectively, may be combined into a single overlay value. For example, the combined or single overlay value may be determined using an averaging method, as provided in EQ. 2, where i=a location of a particular overlay target subset with a different pitch value:

$$OVL_i^{combined} = \frac{OVL_i^{1104} + OVL_i^{1106} + OVL_i^{1108}}{3} \qquad \text{EQ. 2}$$

By way of another example, the combined or single overlay value may be determined using different weighted averages (e.g., where weighting may be generated using metrology target quality), a machine learning algorithm, and/or other algorithmic-based methodology.

The combined or single overlay value may reduce noise originating from one or more sources of errors including, but not limited to, process variations, lithography processes, and metrology processes. For example, the one or more sources or errors may stem from a lithography flow and include, but are not limited to, mask printability errors, lithography tool errors, process tool errors (e.g., etchers, cleaners, or the like), and metrology tool errors.

The combined or single overlay value may be used to set a quality index for each overlay measurement. The combined or single overlay value may be used to disqualify one or more of the overlay measurements $OVL_{1104}$, $OVL_{1106}$, $OVL_{1108}$ due to low performance.

As an alternative to the combined or single overlay value, a reduction in noise in the overlay measurements may be determined using a logistic regression algorithm (LRA). The logistic regression algorithm may receive a data structure as an input. The logistic regression algorithm may then set a random n+1 dimensional vector θ, and assign a probability $h_\theta(x)$ for each n+1 dimensional feature vector x (n features and 1 intercept term) to be a 1. The probability $h_\theta(x)$ may be determined via the sigmoid function in EQ. 3:

$$h_\theta(x) = \frac{1}{1 + e^{\theta^T * x}} \quad \text{EQ. 3}$$

Where the probability $h_\theta(x)$ is larger than a select threshold, the LRA decides the feature vector x to be 1. Where the probability $h_\theta(x)$ is smaller than a select threshold, the LRA decides the feature vector x to be 0. In this regard, the sample may be represented by a set hypersurface that partitions the underlying feature space into two sets, with one set for each class (e.g., 1 or 0), where the hypersurface represents a decision boundary. An error for a specific choice of θ values, and therefore a specific decision boundary, is estimated using a cost function J in EQ. 4:

$$J(\theta) = -\frac{1}{m}[\sum_{i=1}^{m} y^i \log h_\theta(x^{(i)}) + (1 - y^i)\log(1 - h_\theta(x^{(i)}))] \quad \text{EQ. 4}$$

where m is a number of data point (or labels), $y^{(i)}$ is i'th label, and $x^{(i)}$ is a corresponding n+1 dimensional vector of features.

The LRA may iteratively determine an assigned set of values of θ until the cost function J(θ) reaches a minimum, resulting in a determined optimal decision boundary for the two sets, each set representing a class of the two classes.

It is noted herein the LRA may implement polynomial orders of the original features to obtain polynomial decision boundaries in the original feature space.

Figures 11C, 11D:
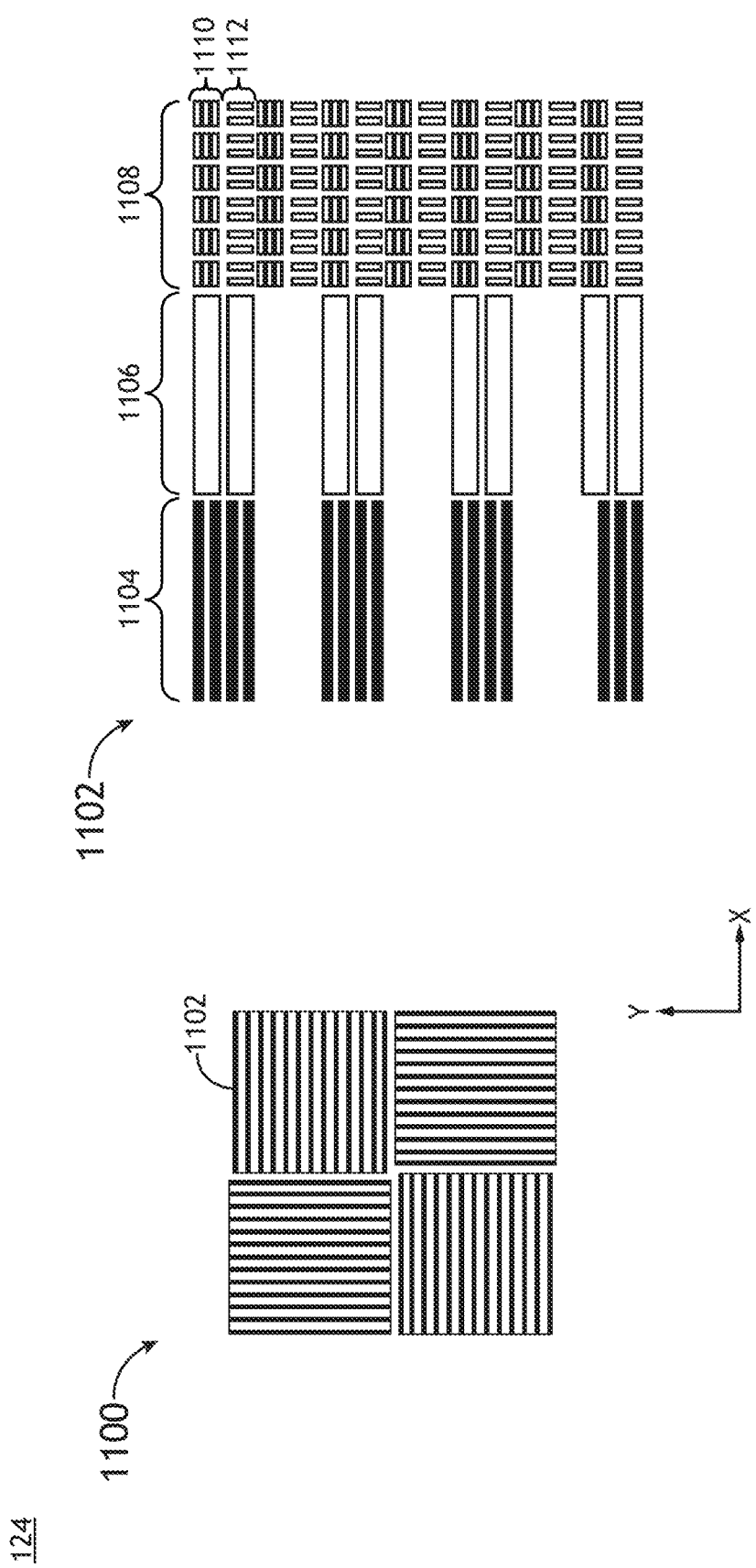
FIG. 11C illustrates a multi-cell SCOL target including multiple pitches, in accordance with one or more embodiments of the present disclosure.
FIG. 11D illustrates a cell of a multi-cell SCOL target including multiple pitches, in accordance with one or more embodiments of the present disclosure.

As illustrated in FIG. 11D, the sample 124 includes one or more device structures 1110. The device structure 1110 may be in a single layer (e.g., a resist layer or a process layer). The device structure 1110 may include sub-structures 1112 and sub-structures 1114. For example, the sub-structures 1112 in a first layer (e.g., a resist layer) and sub-structures 1114 in a second layer (e.g., a process layer). By way of another example, the sub-structures 1112, 1114 may be the same layer.

The one or more device structures 1110 may be measured along with the one or more metrology targets. For example, the one or more devices structures 1110 may be measured with an electron-beam metrology tool to improve an accuracy measured by an optical metrology tool (e.g., an accuracy of the one or more metrology targets).

In one example, a cell 1102 may include a POR pitch 1104 for a first overlay value. The cell 1102 may include a ½× (or half) segmentation size pitch 1106 for a second overlay value. The cell 1102 may include a device structure 1110.

It is noted herein the metrology target 1100 with the one or more cells 1102 as illustrated in FIGS. 11A-11D may be scatterometry targets or imaging base metrology technology targets. It is noted herein the metrology targets may be delivered prior to a metrology measurement stage and then printed on wafers.

It is noted herein the layout of the metrology target 1100 is intended to be illustrative rather than limiting. For example, the metrology target 1100 is not limited to the arrangement or relationship of various structures with various pitches within a particular cell of the target design of the metrology target 1100. Therefore, the above description should not be interpreted as a limitation on the present disclosure but merely an illustration.

In general, it is noted herein the layout of the metrology targets 600, 700, 800, 900, 1000, 1100 in FIGS. 6-11D, respectively, are intended to be illustrative rather than limiting. For example, the one or more layers and/or features within a particular layer of the one or more layers of the metrology targets 600, 700, 800, 900, 1000, 1100 may be arranged in any configuration suitable for an overlay measurement. Therefore, the above description should not be interpreted as a limitation on the present disclosure but merely an illustration.

The multiple pitch targets as illustrated in at least FIGS. 6-11D may be measured with electron-beam metrology tools as described in International Publication No. WO2011026055, published on Mar. 3, 2011; and U.S. patent application Ser. No. 16/477,552, filed on Jul. 12, 2019, which are both incorporated by reference herein to capture an accurate overlay value to be used for calibration. For example, the multiple pitch targets may be measured with back-scattered electron detectors to capture a position of a buried structure. Targets compatible with e-beam metrology is generally discussed in U.S. patent application Ser. No. 16/477,552, filed on Jul. 12, 2019, which is incorporated by reference herein.

The multiple pitch targets may include device structure measured by an electron-beam metrology tool. For example, the electron-beam metrology tool may be configured to, but is not limited to, capturing in a small field of view (FOV) ranging between 1 and 3 microns, where the small field of view may include multiple features of layers (e.g., resist layers and/or process layers). For example, algorithms as described in U.S. Pat. No. 10,473,460, issued on Nov. 12, 2019; and U.S. Pat. No. 10,533,848, issued on Jan. 14, 2020, which are both incorporated by reference herein may be used to estimate an accuracy of both an optical metrology tool-measured overlay or an electron-beam metrology tool overlay.

Figure 12:
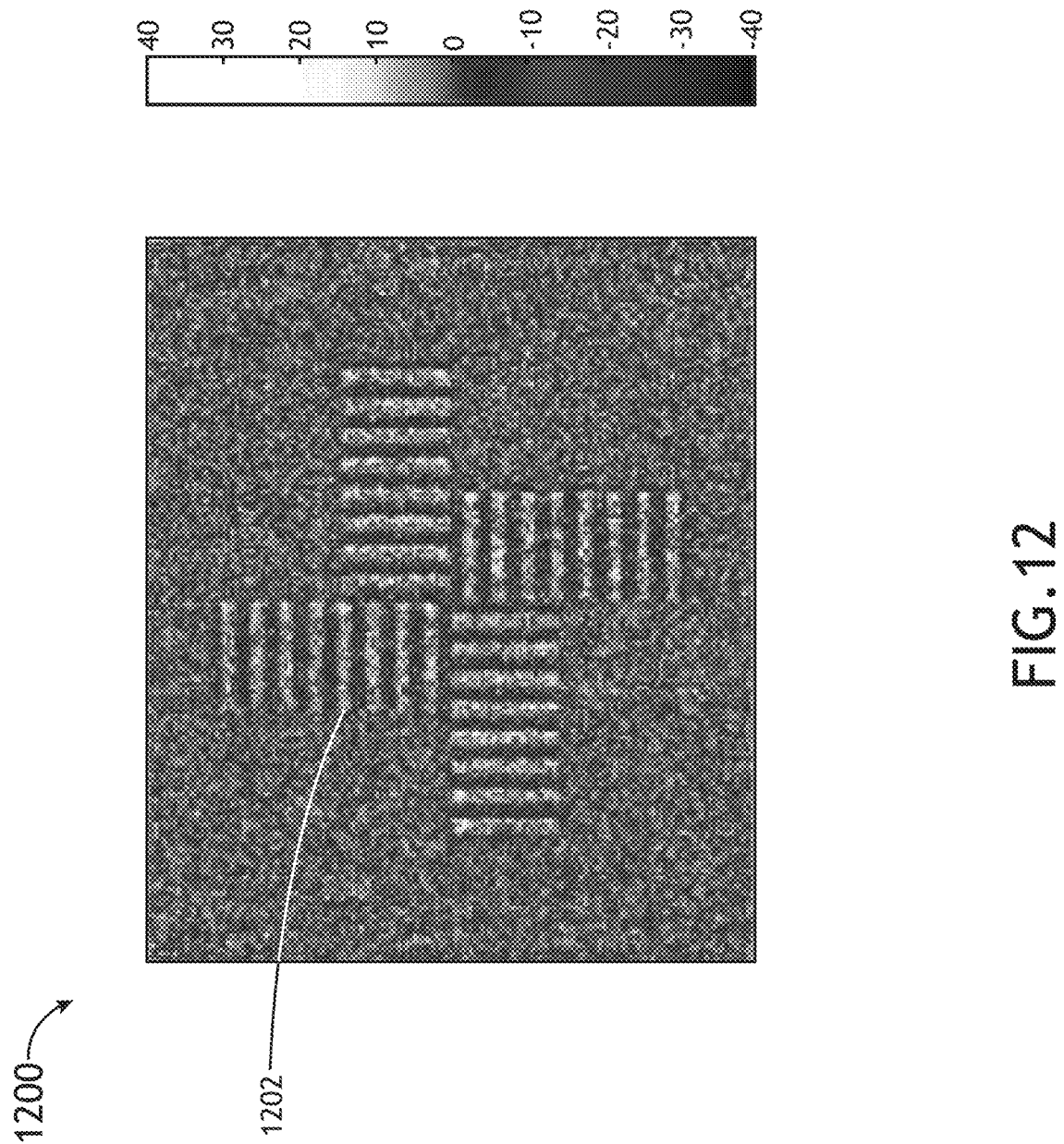
FIG. 12 illustrates a graph comparing images of overlay measurements obtained at different dual aperture device (DAD) positions, in accordance with one or more embodiments of the present disclosure.
Figure 13A:
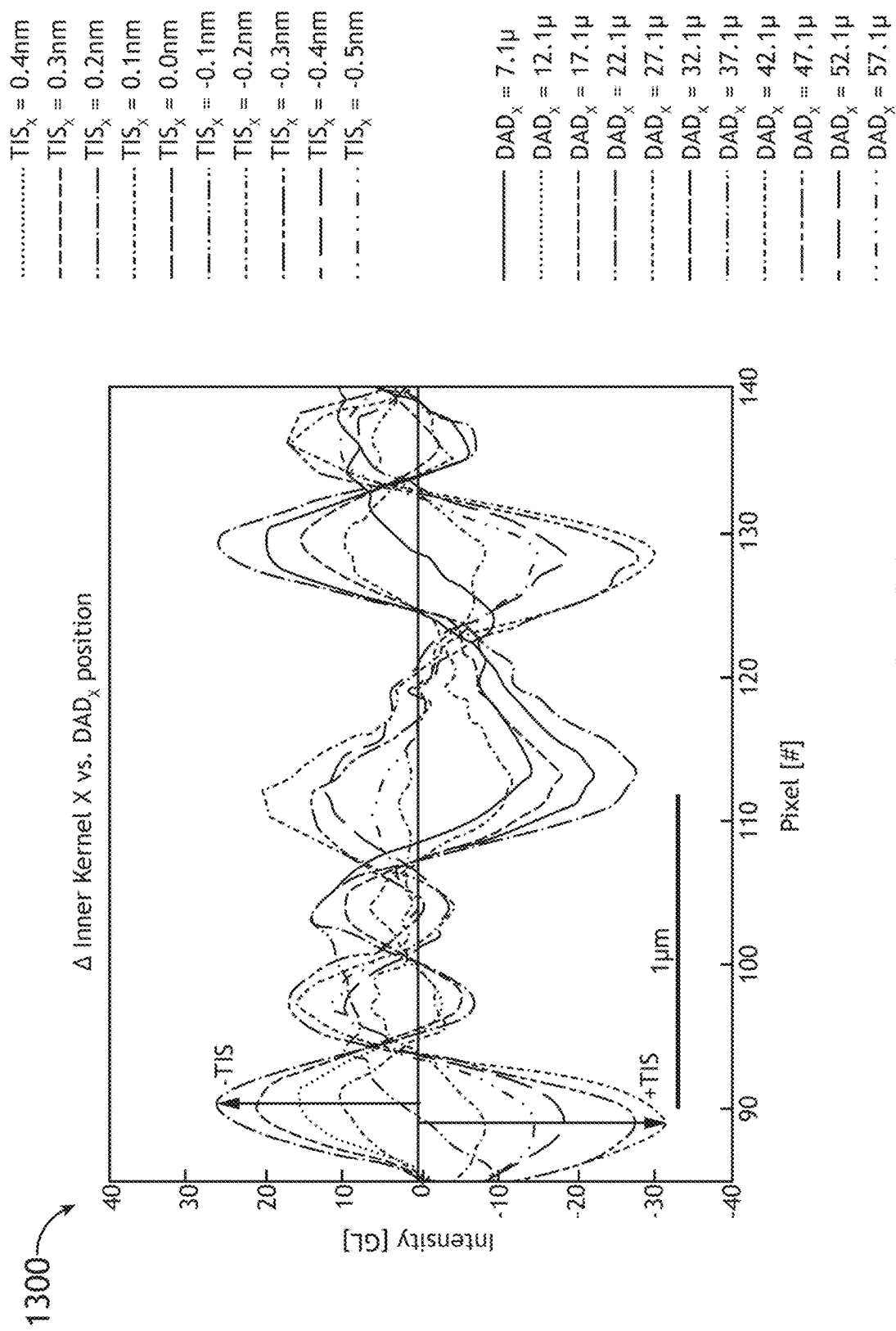
FIG. 13A illustrates a graph comparing overlay measurements obtained at different DAD positions.
Figure 13B:
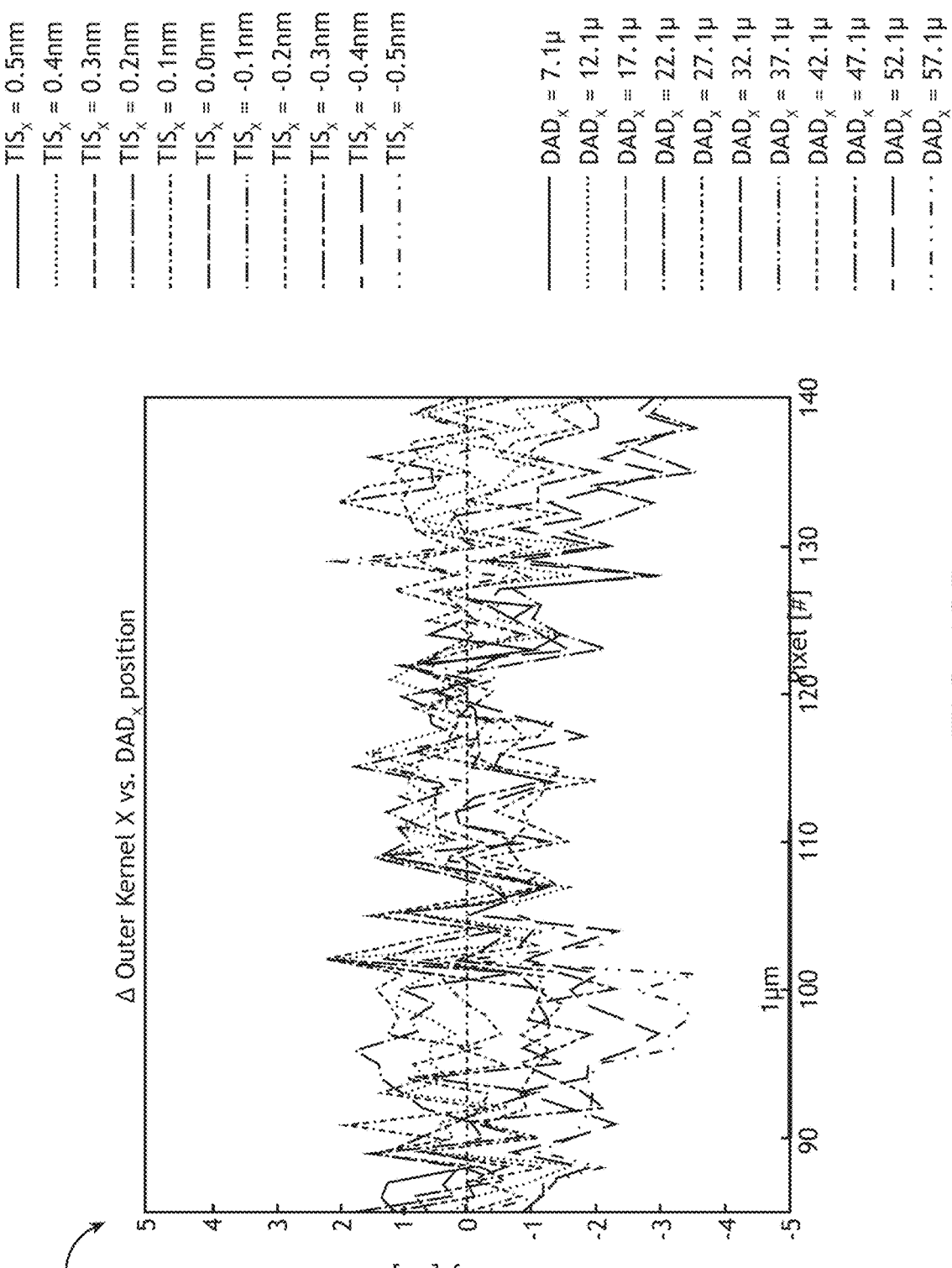
FIG. 13B illustrates a graph comparing overlay measurements obtained at different DAD positions.
Figure 13C:
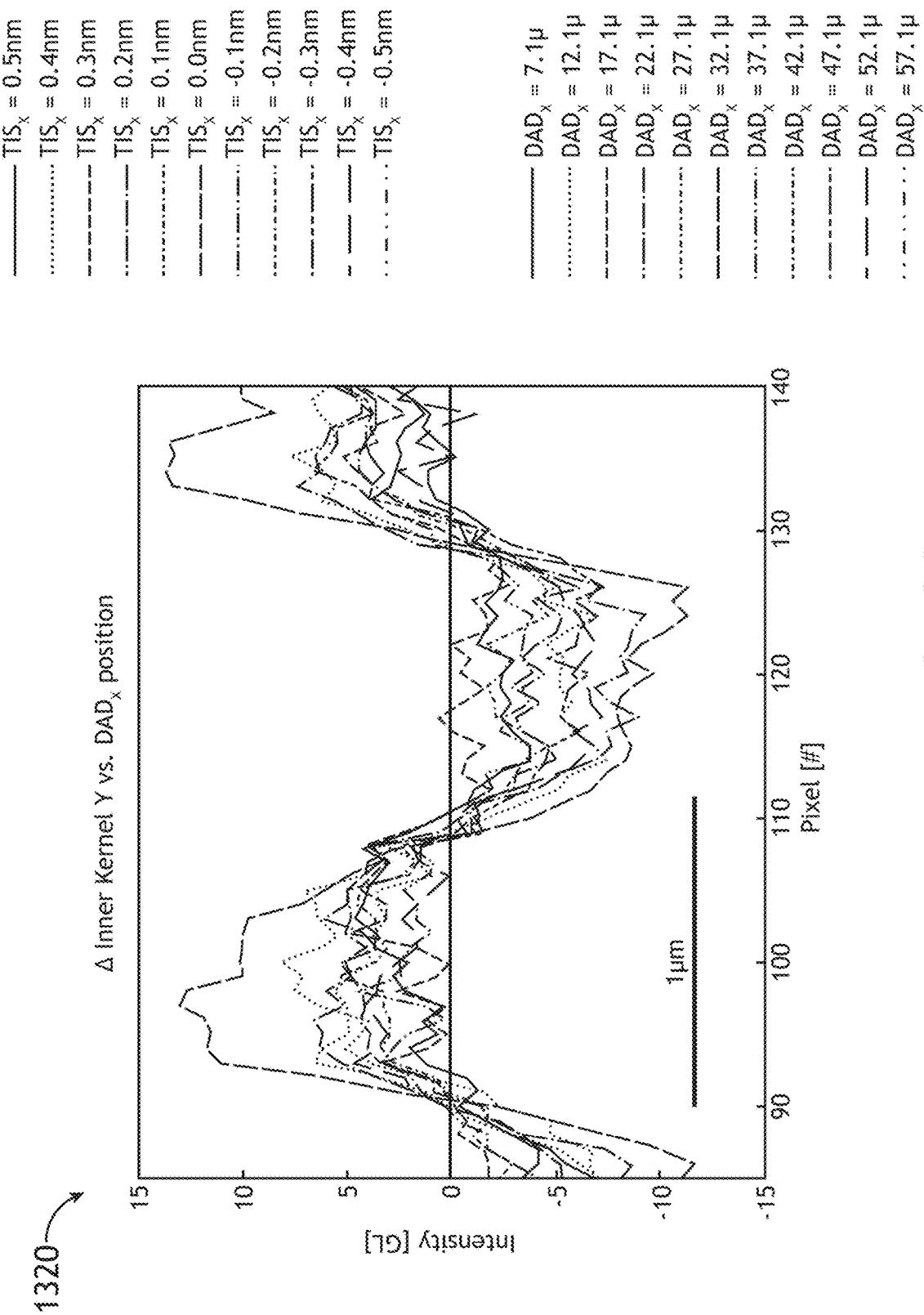
FIG. 13C illustrates a graph comparing overlay measurements obtained at different DAD positions.
Figure 13D:
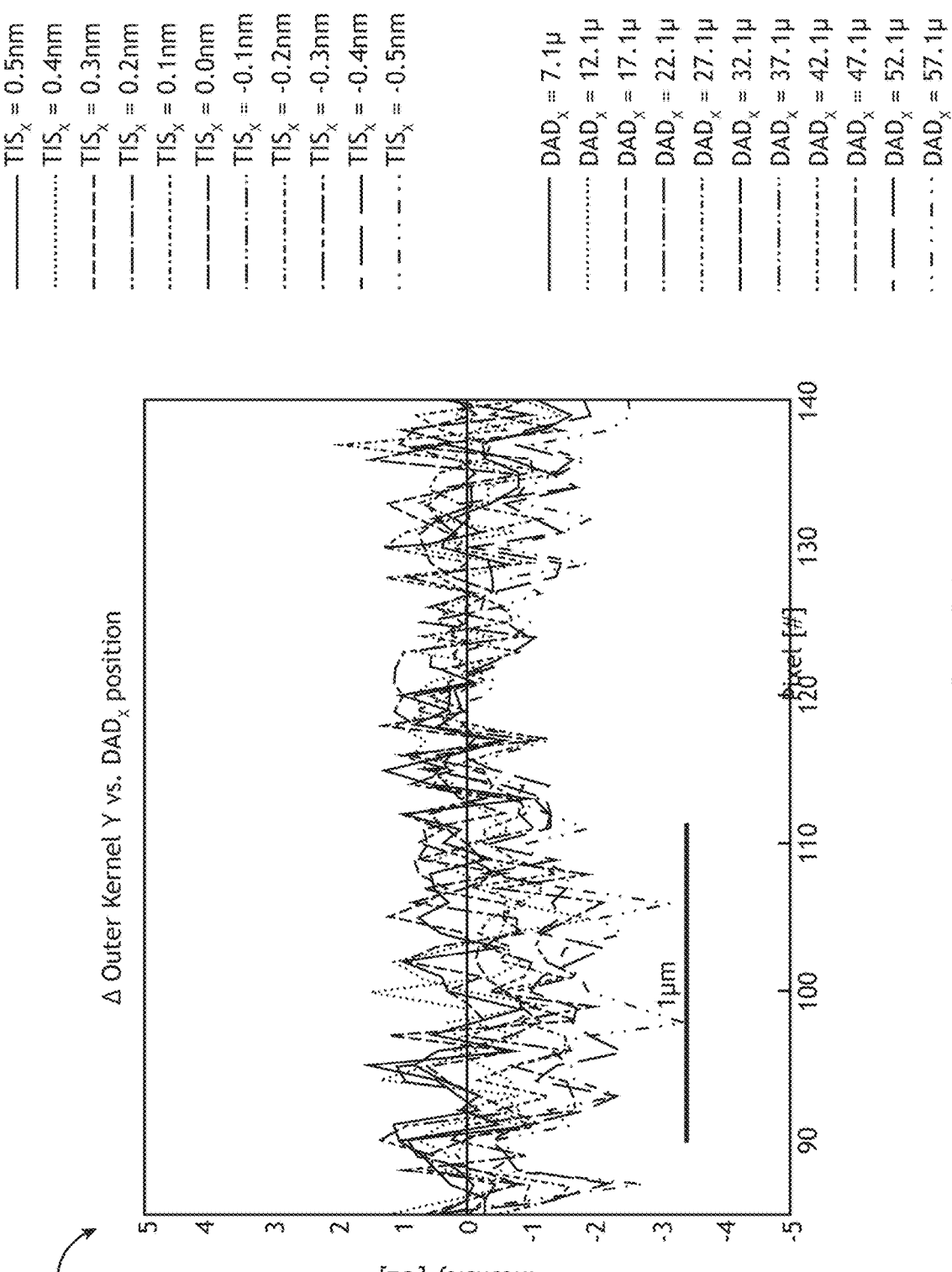
FIG. 13D illustrates a graph comparing overlay measurements obtained at different DAD positions.

FIGS. 12-13D in general illustrate a system and method for error reduction in metrology measurements, in accordance with one or more embodiments of the present disclosure.

The system and method for error reduction in metrology measurements may use a dual aperture device (DAD) to reduce noise (e.g., originating from metrology targets, metrology tools, and/or process effects). The dual aperture device may be installed in the metrology sub-system 104. The dual aperture device may enable a change of light orientation, which may effect a tool induced shift (TIS).

FIG. 12 illustrates a graph 1200 of an example of image sensitivity versus dual aperture device position by comparing a pair of images taken with different dual aperture device positions, where $DAD_x=12.1\mu$ and $TIS_x=0.4$ nm. As illustrated in FIG. 12, the position of the dual aperture device may affect an amplitude of higher harmonics and may impact tool induced shift values.

FIGS. 13A-13D further illustrate examples of image sensitivity versus dual aperture device position in the x-direction for an inner kernel and an outer kernel in both the x-direction and the y-direction, resulting in four graphs 1300, 1310, 1320, and 1330, respectively. For example, FIG. 13A is a graph 1300 illustrating a Δ Inner Kernal X to $DAD_x$ position. By way of another example, FIG. 13B is a graph 1310 illustrating a Δ Outer Kernal X to $DAD_x$ position. By way of another example, FIG. 13C is a graph 1320 illustrating a Δ Inner Kernal Y to $DAD_x$ position. By way of another example, FIG. 13D is a graph 1330 illustrating a Δ Outer Kernal Y to $DAD_x$ position. It is noted herein $TIS_x=0.0$ nm and $DAD_x=32.1\mu$ may be considered the reference DAD position of the graphs 1300, 1310, 1320, and 1330.

In FIGS. 13A-13D, an overlay metrology signal difference between overlay metrology measurements is determined at different $DAD_x$ positions. The graphs 1300, 1310, 1320, and 1330 in FIGS. 13A-13D each represent a region of roughly a single period (e.g., a fundamental harmonic) of the overlay metrology signal. Overlay metrology signals with different TIS values have varying amplitudes of higher harmonics. The kernel difference is determined by EQ. 5:

$$\text{Kernal Difference} = \text{Kernal}(DAD_x(n)) - \text{Kernal}(DAD(x(TIS=0 \text{ pos.})))$$ EQ. 5

It is noted herein for each of the graphs 1300, 1310, 1320, and 1330, the positive change in tool induced shift is below the zero intensity line and the negative change in tool induced shift is above the zero intensity line, as illustrated in FIG. 13A.

Where multiple target designs are included in a single metrology overlay target, select cells, sections or portions, or the like may be incorporated with higher frequency signals for enhancing the sensitivity of tool induced shifts. Where multiple target designs are included in a single metrology overlay target, other select cells, sections or portions, or the like may be designed for overlay calculations.

Figure 14:
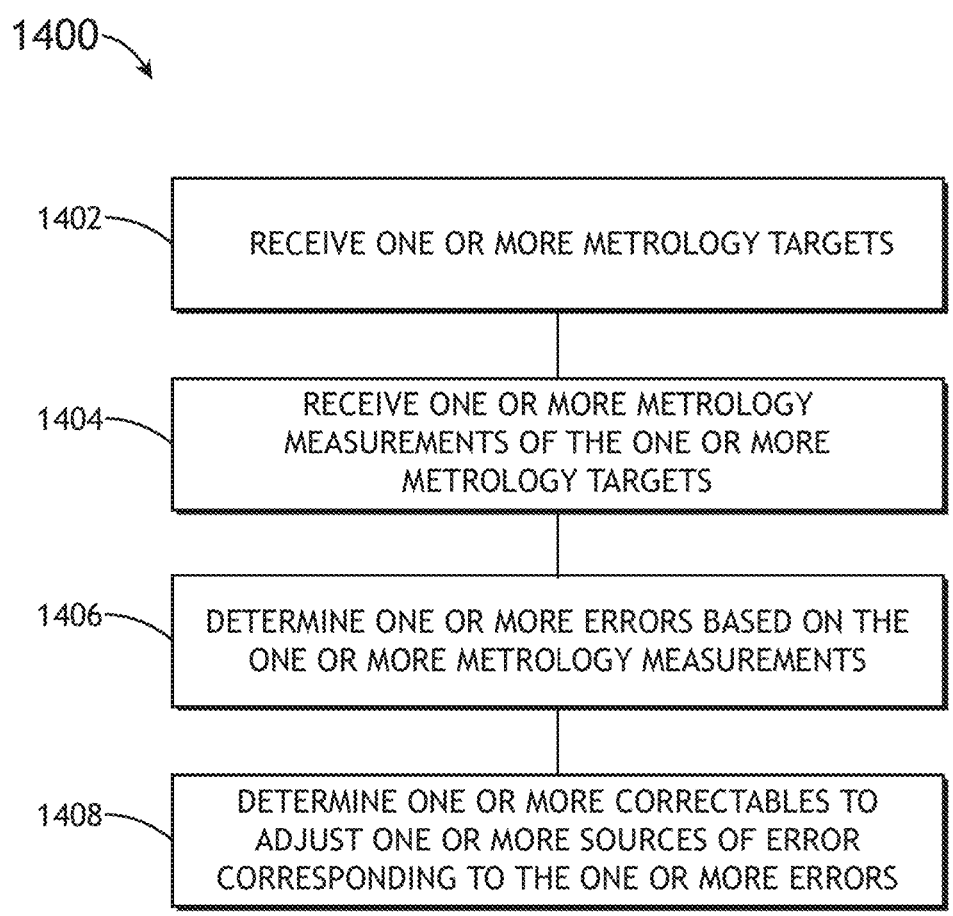
FIG. 14 is a flow diagram illustrating steps performed in a method for field-sensitive overlay metrology, in accordance with one or more embodiments of the present disclosure.

FIG. 14 illustrates a flow diagram of a method or process 1400 for error reduction in metrology measurements, in accordance with one or more embodiments of the present disclosure.

In a step 1402, one or more metrology targets may be received. For example, one of, multiple of, or some combination of the metrology targets 600, 700, 800, 900, 1000, 1100 (e.g., as described with respect to at least the illustrations of FIGS. 6-11D of the present disclosure) may be generated on the sample 124. The one or more metrology target may be generated (e.g., disposed, or the like) on a sample via the lithography sub-system 102 (e.g., as described with respect to at least the illustrations of FIGS. 1A, 1B of the present disclosure).

In a step 1404, one or more metrology measurements of the one or more metrology targets may be received. The one or more overlay metrology measurements of the one or more metrology targets may be received via the metrology sub-system 104 (e.g., as described with respect to at least the illustrations of FIGS. 1A, 1B of the present disclosure). The metrology sub-system 104 may include a single aperture device. The metrology sub-system 104 may include a dual aperture device (e.g., as described with respect to at least the illustrations of FIGS. 12-13D of the present disclosure). The metrology data may include overlay data in the x-direction and/or the y-direction for multiple metrology targets. For example, the multiple metrology targets may be different types with different target designs. By way of another example, the multiple metrology targets may be a same or similar type with a same or similar target design (e.g., in some cases, an identical target design).

In a step 1406, one or more errors may be determined based on the one or more metrology measurements. The one or more errors may originate from one or more sources. For example, the one or more errors may stem from a lithography flow and may include, but are not limited to, mask printability errors, lithography tool errors, process tool errors (e.g., etchers, cleaners, or the like), and/or metrology tool errors (e.g., as described with respect to at least the illustrations of FIGS. 1A-1C of the present disclosure).

The one or more errors may be determined from a combined metrology value (e.g., as described with respect to at least the illustrations of FIGS. 2-5D of the present disclosure). The combined metrology value may be determined from the generated metrology data. For example, the combined metrology value may be determined through applying an average to the metrology data, applying a weighted average to the metrology data, or applying another algorithmic-based methodology. The one or more errors may be determined from applying a logistic regression algorithm (e.g., as described with respect to at least the illustrations of FIGS. 12-13D of the present disclosure).

In a step 1408, one or more correctables may be determined to adjust the one or more sources of error corresponding to the determined one or more errors. The one or more correctables may be fed into a feed-forward loop or a feedback loop of the system 100. For example, the one or more correctables may be fed to the origination of one or more sources of errors (e.g., fabrication tools, metrology tools, controllers, or the like of the system 100, as described with respect to at least the illustrations of FIGS. 1A-1C of the present disclosure).

It is noted herein the method or process 1400 is not limited to the steps and/or sub-steps provided. The method or process 1400 may include more or fewer steps and/or sub-steps. For example, the method or process 1400 may only include step 1402 and any steps or sub-steps related to step 1402 as described throughout the present disclosure. By way of another example, the method or process 1400 may only include steps 1404 and 1406 and any steps or sub-steps related to step 1404 and 1406 as described throughout the present disclosure. By way of another example, the method or process 1400 may or may not include step 1408 and any steps or sub-steps related to step 1408 as described throughout the present disclosure. In addition, the method or process 1400 may perform the steps and/or sub-steps simultaneously. Further, the method or process 1400 may perform the steps and/or sub-steps sequentially, including in the order provided or an order other than provided. Therefore, the above description should not be interpreted as a limitation on the scope of the disclosure but merely an illustration.

It is noted herein that any language directed to a particular embodiment described in the present disclosure may be applicable to a different embodiment described in the present disclosure, such that the various embodiments described in the present disclosure should not be considered stand-alone or separate embodiments. For example, the present disclosure may be read as being able to combine any number of one or more metrology targets, one or more layers, one or more cells, one or more target designs, and/or one or more pitches or other parameters or metrics of the target design as described throughout the present disclosure on the sample 124. By way of another example, the present disclosure may be read as being able to combine any number of metrology sample or target design processes, fabrication processes, and/or measurement processes as described throughout the present disclosure. Therefore, the above description should not be interpreted as a limitation on the present disclosure but merely an illustration.

In this regard, the embodiments of the present disclosure illustrate new methods and systems for reducing noise originating from process variations, lithography processes, and/or metrology errors, where the noise being reduced where caused by performing metrology overlay measurements on only a single metrology targets and generating overlay values between the current layer and the previous layer. In general, the new methods and systems use overlay metrology measurements from multiple targets (e.g., either the same or similar target designs (e.g., in some cases, identical target designs) or having different target designs), uses a new target which includes different target designs embedded in one target cell, and/or uses a dual aperture device.

Specifically, the new methods and systems may reduce noise by using multiple targets with the same or similar design, may reduce noise by using multiple targets with different target designs, may reduce noise by using one target with multiple layers (e.g., may reduce process origin noise by averaging on multiple targets), may reduce noise by using multiple setups and multiple targets, and/or may reduce noise by improving dual aperture device location for tool induced shift reduction. The new methods and systems may result in an improved OVL prediction using multi-cell target and different design, and/or an improved accuracy using multi-cell target and different design. The new methods and systems may combine several elements per site. The new methods and systems may use OVL measurements from multiple targets (with different TD) or one target with multiple layers to reduce the noise affecting OVL measurements.

In addition, the new methods and systems may reduce device to target error by removing non-scanner error as actual device structures are measured. The new system and methods may use electron-beam measurements for improvements in accuracy.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random-access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system for error reduction in metrology measurements, comprising:
   a controller communicatively coupled to one or more metrology tools configured to hold a metrology sample, wherein the controller includes one or more processors configured to execute program instructions causing the one or more processors to:
   receive one or more metrology measurements of one or more metrology targets of the metrology sample, wherein a metrology target of the one or more metrology targets include one or more target designs with one or more cells, wherein the one or more target designs are generated on a plurality of layers of the metrology sample, wherein the plurality of layers include a resist layer, a first process layer with a first target design, a second process layer with a second target design, and a third process layer with a third target design;
   determine one or more errors based on the one or more metrology measurements; and
   determine one or more correctables to adjust one or more sources of error corresponding to the one or more errors, wherein the one or more correctables are configured to reduce an amount of noise in the one or more metrology measurements generated by the one or more sources of error.

2. The system of claim 1, wherein the plurality of layers include a box in box target design in a resist layer surrounding at least one target design in at least one process layer.

3. The system of claim 1, wherein the one or more metrology tools include at least one of an electron-beam metrology tool or an optical metrology tool.

4. The system of claim 1, wherein the one or more metrology measurements are obtained via a dual aperture device generating a change in light orientation effecting a tool induced shift of the one or more metrology measurements.

5. The system of claim 1, wherein the one or more errors are determined based on the one or more metrology measurements by averaging the one or more metrology measurements to determine a combined overlay value.

6. The system of claim 1, wherein the one or more errors are determined based on the one or more metrology measurements through a logistic regression algorithm.

7. The system of claim 1, wherein the one or more sources of error include at least one of one or more process variations, one or more lithography processes of one or more lithography tools, or one or more metrology processes of the one or more metrology tools.

8. The system of claim 7, wherein the one or more processors are configured to execute program instructions causing the one or more processors to:
   receive the one or more metrology targets of the metrology sample, wherein the one or more metrology targets are received prior to the one or more metrology targets being generated on the metrology sample via the one or more lithography tools.

9. The system of claim 1, wherein the plurality of layers include a box in box target design in a process layer surrounding at least one target design in at least one resist layer.

10. The system of claim 9, wherein the plurality of layers include a resist layer and a process layer with a first target design and a second target design.

11. The system of claim 1, wherein the one or more metrology targets include a plurality of metrology targets.

12. The system of claim 11, wherein each metrology target of the plurality of metrology targets includes an identical design of the one or more target designs.

13. The system of claim 11, wherein the one or more target designs include a plurality of target designs.

14. The system of claim 13, wherein at least one metrology target of the plurality of metrology targets includes a first target design of the plurality of target designs, wherein the at least one metrology target of the plurality of metrology targets includes a second target design of the plurality of target designs.

15. The system of claim 14, wherein the first target design differs from the second target design in at least one of pitch, critical dimension, segmentation size, or induced overlay.

16. The system of claim 1, wherein a cell of the one or more cells includes a plurality of pitches.

17. The system of claim 16, wherein the plurality of pitches include a plan of record pitch, a first pitch of a different segmentation size, and a second pitch of a different segmentation size.

18. The system of claim 17, wherein the first pitch is a half-segmentation size as compared to the plan of record pitch, wherein the second pitch is a double-segmentation size as compared to the plan of record pitch.

19. The system of claim 16, wherein the metrology sample includes one or more device structures.

20. The system of claim 19, wherein the plurality of pitches include a plan of record pitch and at least one pitch of a different segmentation size, wherein the one or more device structures are measured along with the plan of record pitch and the at least one pitch of a different segmentation size.

21. A system for error reduction in metrology measurements, comprising:
one or more metrology tools configured to hold a metrology sample; and
a controller communicatively coupled to the one or more metrology tools, wherein the controller includes one or more processors configured to execute program instructions causing the one or more processors to:
receive one or more metrology measurements of one or more metrology targets of the metrology sample, wherein a metrology target of the one or more metrology targets include one or more target designs with one or more cells, wherein the one or more target designs are generated on a plurality of layers of the metrology sample, wherein the plurality of layers include a resist layer, a first process layer with a first target design, a second process layer with a second target design, and a third process layer with a third target design;
determine one or more errors based on the one or more metrology measurements; and
determine one or more correctables to adjust one or more sources of error corresponding to the one or more errors, wherein the one or more correctables are configured to reduce an amount of noise in the one or more metrology measurements generated by the one or more sources of error.

22. The system of claim 21, further comprising:
one or more lithography tools configured to generate the one or more metrology targets on the metrology sample,
wherein the one or more processors are configured to execute program instructions causing the one or more processors to:
receive the one or more metrology targets of the metrology sample prior to the one or more lithography tools generating the one or more metrology targets on the metrology sample.

23. A method comprising:
receiving one or more metrology measurements of one or more metrology targets of a metrology sample from one or more metrology tools, wherein a metrology target of the one or more metrology targets include one or more target designs with one or more cells, wherein the one or more target designs are generated on a plurality of layers of the metrology sample, wherein the plurality of layers include a resist layer, a first process layer with a first target design, a second process layer with a second target design, and a third process layer with a third target design;
determining one or more errors based on the one or more metrology measurements; and
determining one or more correctables to adjust one or more sources of error corresponding to the one or more errors, wherein the one or more correctables are configured to reduce an amount of noise in the one or more metrology measurements generated by the one or more sources of error.

24. The method of claim 23, further comprising:
receiving the one or more metrology targets of the metrology sample.

25. The method of claim 24, further comprising:
generating the one or more metrology targets on the metrology sample via one or more lithography tools, wherein the one or more metrology targets are received prior to the one or more metrology targets being generated on the metrology sample by the one or more lithography tools.

* * * * *